United States Patent
Nakada et al.

(10) Patent No.: US 9,362,038 B2
(45) Date of Patent: Jun. 7, 2016

(54) MAGNETIC ELEMENT

(71) Applicant: TDK CORPORATION, Tokyo (JP)

(72) Inventors: Katsuyuki Nakada, Tokyo (JP);
Takahiro Suwa, Tokyo (JP); Kuniyasu Ito, Tokyo (JP); Takumi Aoki, Tokyo (JP); Tetsuya Shibata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 14/613,852

(22) Filed: Feb. 4, 2015

(65) Prior Publication Data

US 2015/0228394 A1    Aug. 13, 2015

(30) Foreign Application Priority Data

Feb. 12, 2014  (JP) .................................. 2014-024288
Jan. 26, 2015  (JP) .................................. 2015-012180

(51) Int. Cl.
    *G11B 5/127*        (2006.01)
    *H01F 10/32*        (2006.01)
    (Continued)

(52) U.S. Cl.
    CPC ............ *H01F 10/3268* (2013.01); *G11B 5/127* (2013.01); *G11C 11/161* (2013.01); *H01F 3/10* (2013.01); *H01F 7/20* (2013.01); *H01L 43/08* (2013.01)

(58) Field of Classification Search
    CPC ........... G11B 5/127; G11B 5/147; G11B 5/33
    USPC .............. 360/125.3, 125.03, 125.09, 125.04, 360/125.17, 125.12, 125.06, 125.15, 360/125.26, 125.19
    See application file for complete search history.

(56) References Cited

U.S. PATENT DOCUMENTS

| | | | |
|---|---|---|---|
| 2003/0184918 A1* | 10/2003 | Lin .................. | B82Y 10/00 360/314 |
| 2003/0184919 A1* | 10/2003 | Lin .................. | B82Y 10/00 360/314 |

(Continued)

FOREIGN PATENT DOCUMENTS

| | | |
|---|---|---|
| JP | 2004-354181 A | 12/2004 |
| JP | 2006-303097 A | 11/2006 |

(Continued)

OTHER PUBLICATIONS

Tulapurkar et al., "Spin-torque diode effect in magnetic tunnel junctions," Nature, vol. 438, No. 7066, pp. 339-342, 2005.

(Continued)

*Primary Examiner* — Allen T Cao
(74) *Attorney, Agent, or Firm* — Oliff PLC

(57) ABSTRACT

A magnetic element including a magnetoresistive effect film (MEF). Magnetic element includes an MEF and nonmagnetic spacer layer, first and second ferromagnetic layers, wherein layers being disposed with nonmagnetic spacer layer interposed therebetween, pair of electrodes disposed with MEF interposed therebetween in stacking direction of MEF at least two first soft magnetic layers, coil, and second soft magnetic layer magnetically connected to coil, wherein second soft magnetic layer has ring-like shape, spacing distance between second soft magnetic layer and MEF is larger than first soft magnetic layer and MEF, film thickness of second soft magnetic layer is larger than first soft magnetic layer, part of the two first soft magnetic layers overlaps a part of second soft magnetic layer in stacking direction of MEF, first and second soft magnetic layers are magnetically coupled to each other, and MEF is disposed between respective fore ends of two first soft magnetic layers.

19 Claims, 23 Drawing Sheets

(51) Int. Cl.
*H01F 3/10* (2006.01)
*H01F 7/20* (2006.01)
*H01L 43/08* (2006.01)
*G11C 11/16* (2006.01)

(56) References Cited

U.S. PATENT DOCUMENTS

2006/0227466 A1* 10/2006 Yagami .................. B82Y 25/00
360/324.2
2006/0256485 A1* 11/2006 Seigler .................. B82Y 10/00
360/324.12

2007/0176519 A1 8/2007 Sbiaa et al.
2010/0264959 A1 10/2010 Maehara

FOREIGN PATENT DOCUMENTS

JP 2007-184923 A 7/2007
WO 2010/119569 A1 10/2010

OTHER PUBLICATIONS

Suzuki et al., "Microwave Properties of Spin Injection Devices—Spontaneous Oscillation, Spin-Torque Diode Effect and Magnetic Noise," Magune, vol. 2, No. 6, 2007.

* cited by examiner

MAGNETIC ELEMENT

BACKGROUND

The present invention relates to a magnetic element that is applied to, for example, a novel functional element for use in wireless signal transmission and communication.

Recently, attention has been focused on the field of spintronics utilizing charges and spins of electrons at the same time instead of the field of electronics employing charges of electrons (Non-Patent Reference 1). The spintronics greatly contributes to the industry in the form of a hard disk drive (HDD) and a magnetoresistive memory (MRAM) with quick development of magnetoresistive effect elements based on magnetoresistive effects that are represented by a giant magnetoresistive (GMR) effect and a tunneling magnetoresistive (TMR) effect.

Regarding a magnetoresistive effect element, it is known that, through transfer and transport of a spin of one ferromagnetic substance, energy (spin-transfer torque) to rotate a spin of the other ferromagnetic substance is generated. When the spin-transfer torque and torque caused by an external magnetic field are brought into the condition of being close to each other, a spin oscillation and resonance phenomenon occurs. Utilizing such a phenomenon in industrial fields as devices for oscillation and detection, a mixer, a filter, etc. in the high-frequency range has been proposed (Patent Reference 1). It is also known that high-frequency characteristics of the magnetoresistive effect element are controlled by the applied magnetic field and the spin-transfer torque (Non-Patent Reference 2).

An element (hereinafter referred to as a "magnetic element") utilizing high-frequency characteristics of the magnetoresistive effect element can be controlled by the applied magnetic field as mentioned above. Considering an application to the industrial field, however, the magnetic element is required to have an element structure that includes a magnetic field applying mechanism capable of variably controlling the intensity and the direction of the applied magnetic field over a wide range.

As one example of the element structure including the magnetic field applying mechanism for variably controlling the intensity of the applied magnetic field, there is proposed a structure for applying a coil magnetic field, which is generated through current control, to a magnetoresistive effect film (Patent Reference 2).

Furthermore, as one example of the element structure including the magnetic field applying mechanism for variably controlling the direction of the applied magnetic field, there is proposed an element structure including a bias magnetic field applying unit, and an adjustment-purpose magnetic field applying unit that is disposed in a direction different from the direction of a bias magnetic field (Patent Reference 3).

CITED REFERENCES

Patent References

[Patent Reference 1] International Publication No. WO2010/119569
[Patent Reference 2] Japanese Unexamined Patent Application Publication No. 2006-303097
[Patent Reference 3] Japanese Unexamined Patent Application Publication No. 2007-184923

Non-Patent References

[Non-Patent Reference 1] Nature, Vol. 438, No. 7066, pp. 339-342, 17 Nov. 2005

[Non-Patent Reference 2] Magune, Vol. 2, No. 6, 2007, pp 282-290

SUMMARY

However, the related art has the following problems.

In the structure disclosed in Patent Reference 2, a magnetic guide path layer including a coil wound around the same is formed to extend directly up to the vicinity of the magnetoresistive effect film. In that structure, because a film thickness of the magnetic guide path layer is specified to a value comparable to that of the magnetoresistive effect film, a magnetic field generated from the coil is greatly attenuated in the magnetic guide path layer, and the magnetic field within the magnetic guide path layer near the magnetoresistive effect is reduced. On the other hand, in trying to sufficiently thicken the film of the magnetic guide path layer to increase the magnetic field, the magnetic guide path layer is needed to be disposed at a position sufficiently away from the magnetoresistive effect film. In that case, the magnetic field released from the magnetic guide path layer is leaked to the outside before being applied to the magnetoresistive effect film. This causes the problem that the magnetic field of sufficient intensity is not applied to the magnetoresistive effect film.

The structure disclosed in Patent Reference 3 includes a bias magnetic field applying unit, and an adjustment-purpose magnetic field applying unit that is formed in the direction different from the direction of the bias magnetic field. In that structure, a combined magnetic field resulting from the bias magnetic field and the adjustment-purpose magnetic field is applied to the magnetoresistive effect film. The intensity of the combined magnetic field is changed by changing the intensity of the adjustment-purpose magnetic field. As a result, an oscillation frequency can be set to the desired value. Patent Reference 3, however, does not clearly state a practical structure for applying the magnetic field.

The present invention has been accomplished with intent to solve the above-mentioned problems, and an object of the present invention is to provide a magnetic element in which a magnetic field of sufficient intensity is applied to a magnetoresistive effect film.

To achieve the above-mentioned object, the present invention provides a magnetic element comprising a magnetoresistive effect film including a nonmagnetic spacer layer, a first ferromagnetic layer, and a second ferromagnetic layer, the first and second ferromagnetic layers being disposed with the nonmagnetic spacer layer interposed therebetween, a pair of electrodes disposed with the magnetoresistive effect film interposed therebetween in a stacking direction of the magnetoresistive effect film, at least two first soft magnetic layers, a magnetic field generation source using a current, and a second soft magnetic layer magnetically connected to the magnetic field generation source, wherein the second soft magnetic layer has a ring-like shape, a spacing distance between the second soft magnetic layer and the magnetoresistive effect film is larger than a spacing distance between the first soft magnetic layer and the magnetoresistive effect film, a film thickness of the second soft magnetic layer is larger than a film thickness of the first soft magnetic layer, a part of each of the at least two first soft magnetic layers overlaps a part of the second soft magnetic layer in the stacking direction, the first soft magnetic layer and the second soft magnetic layer are magnetically coupled to each other, and the magnetoresistive effect film is disposed between respective fore ends of the at least two first soft magnetic layers.

In the present invention, when the magnetoresistive effect film is disposed such that a magnetic field between respective fore ends of two first soft magnetic layers is applied to the magnetoresistive effect film, such a state is regarded as being involved in the state expressed by the "magnetoresistive effect film is disposed between the respective fore ends of the two first soft magnetic layers".

With the features of the present invention, the magnetic flux generated from the magnetic field generation source propagates into the second soft magnetic layer. Because of having the ring-like shape, the second soft magnetic layer can suppress the magnetic flux therein from leaking to the outside. Furthermore, since the spacing distance between the second soft magnetic layer and the magnetoresistive effect film can be increased, the film thickness of the second soft magnetic layer can be set to a sufficiently large value, and the magnetic flux generated from the magnetic field generation source can be propagated in a larger amount to the second soft magnetic layer. Moreover, since a part of each of the at least two first soft magnetic layers overlaps a part of the second soft magnetic layer in the stacking direction of the magnetoresistive effect film and the first soft magnetic layer and the second soft magnetic layer are magnetically coupled to each other, the magnetic flux generated in the second soft magnetic layer can be propagated to the first soft magnetic layer. By dividing a propagation path of the magnetic flux generated from the magnetic field generation source into the first soft magnetic layer and the second soft magnetic layer as described above, a magnetic path length of the first soft magnetic layer having a comparatively small film thickness can be shortened. As a result, an amount of attenuation of the magnetic flux in the first soft magnetic layer is reduced, and the magnetic field can be generated at sufficient intensity from the first soft magnetic layer. Thus, with the arrangement that the magnetoresistive effect film is disposed between respective fore ends of the at least two first soft magnetic layers, the magnetic field of sufficient intensity can be applied to the magnetoresistive effect film from the first soft magnetic layers.

Furthermore, the magnetic element of the present invention is featured in that the first soft magnetic layers are each in form of a flat plate, and a third soft magnetic layer is disposed between the first soft magnetic layer and the second soft magnetic layer.

Still furthermore, the magnetic element of the present invention is featured in that the second soft magnetic layer and the third soft magnetic layer are directly connected to each other.

Still furthermore, the magnetic element of the present invention is featured in that the first soft magnetic layer and the third soft magnetic layer are directly connected to each other.

Still furthermore, the magnetic element of the present invention is featured in that the first soft magnetic layer and the third soft magnetic layer are directly connected to each other, and the second soft magnetic layer and the third soft magnetic layer are directly connected to each other.

Still furthermore, the magnetic element of the present invention is featured in that a saturation magnetic flux density of the first soft magnetic layer is larger than a saturation magnetic flux density of the second soft magnetic layer.

Still furthermore, the magnetic element of the present invention is featured in that a saturation magnetic flux density of the first soft magnetic layer is larger than a saturation magnetic flux density of the third soft magnetic layer.

With the magnetic element according to the present invention, the magnetic field of sufficient intensity can be applied to the magnetoresistive effect film.

DETAILED DESCRIPTION OF EMBODIMENTS

Exemplary embodiments of the present invention will be described below with reference to the drawings. It is to be noted that the present invention is not limited by the matters described in the following embodiments. Furthermore, addition, omission, replacement, and other alterations of components in the embodiments can be made within the scope not departing from the gist of the present invention.

First Embodiment

Figure 1:
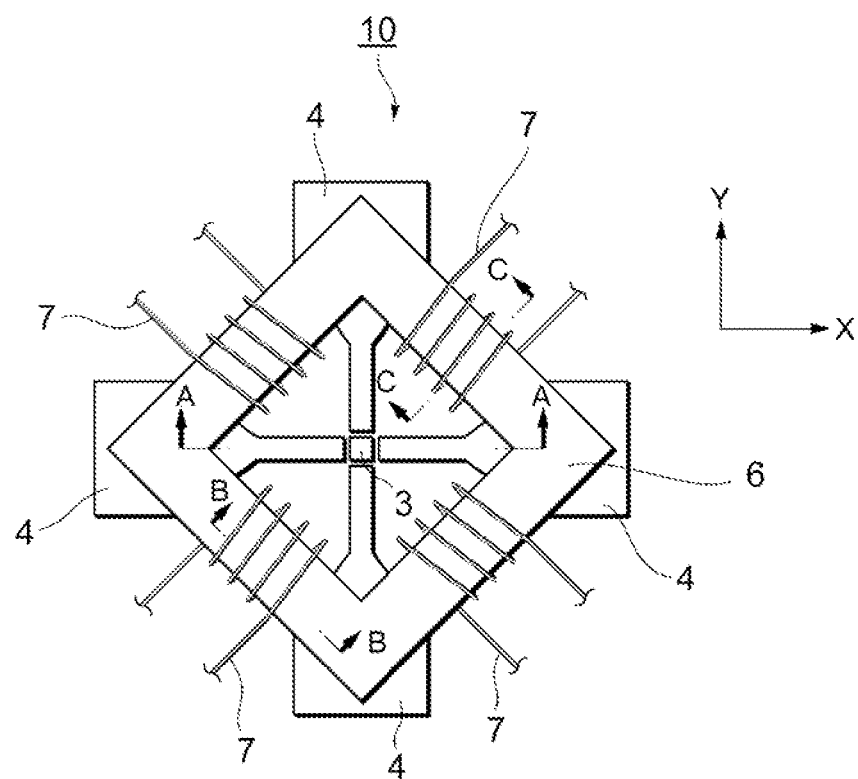
FIG. 1 is a plan view of a magnetic element 10 according to a first embodiment of the present invention.
Figure 2:
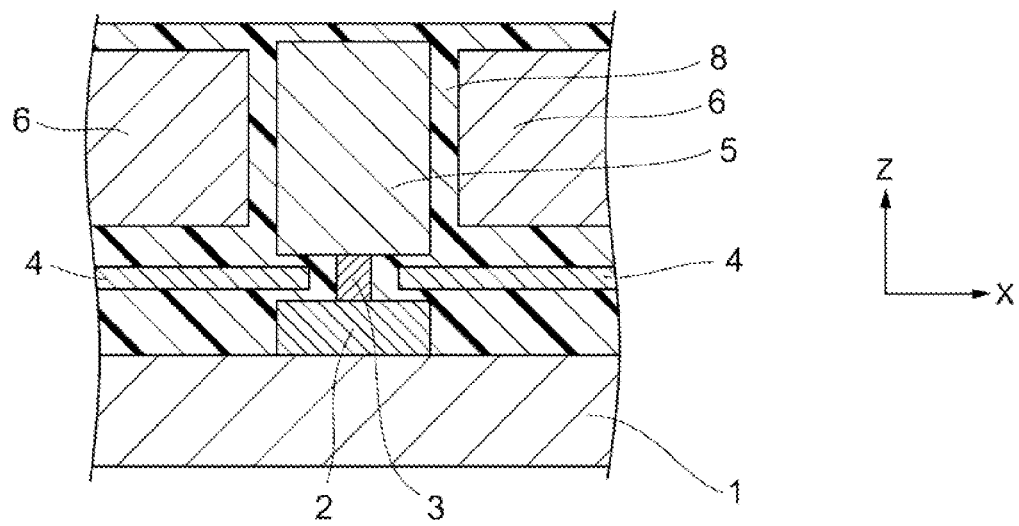
FIG. 2 is a sectional view taken along a line A-A in FIG. 1.
Figure 3:
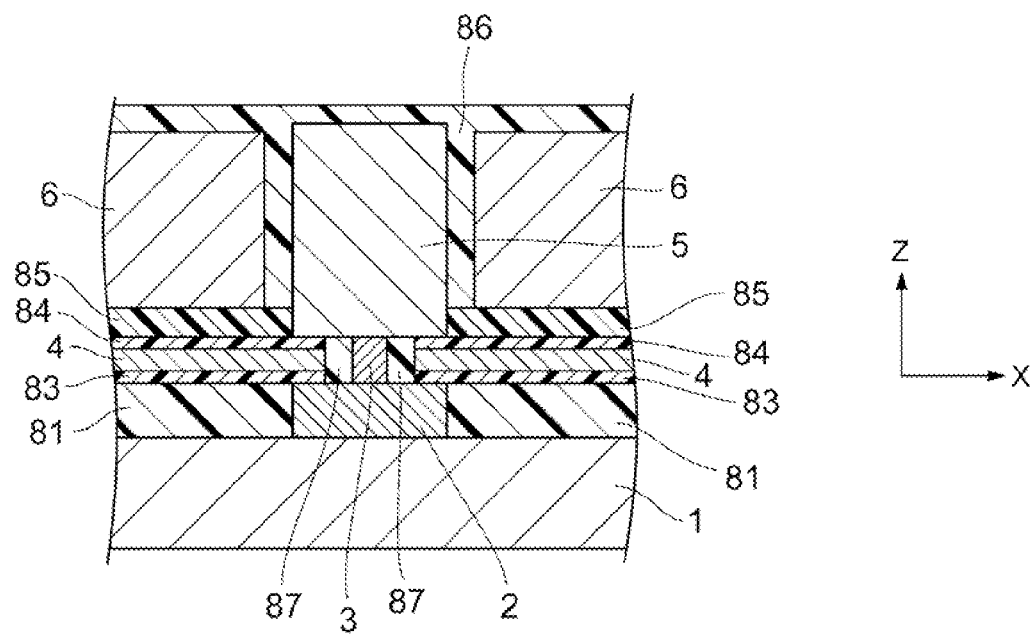
FIG. 3 illustrates, in detail, individual portions of an insulating layer 8 illustrated in FIG. 2.
Figure 4:
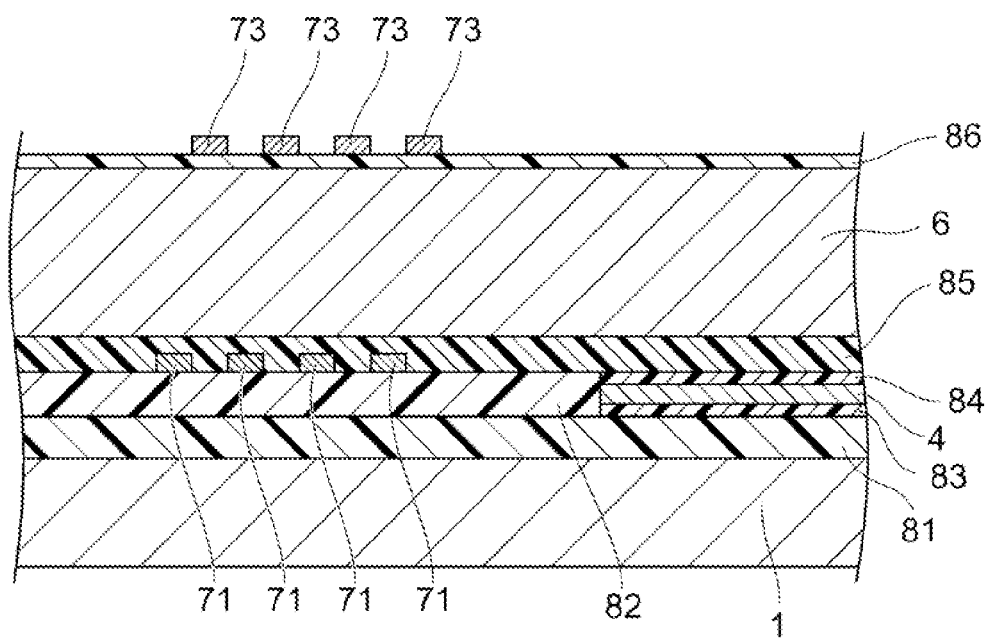
FIG. 4 is a sectional view taken along a line B-B in FIG. 1.
Figure 5:
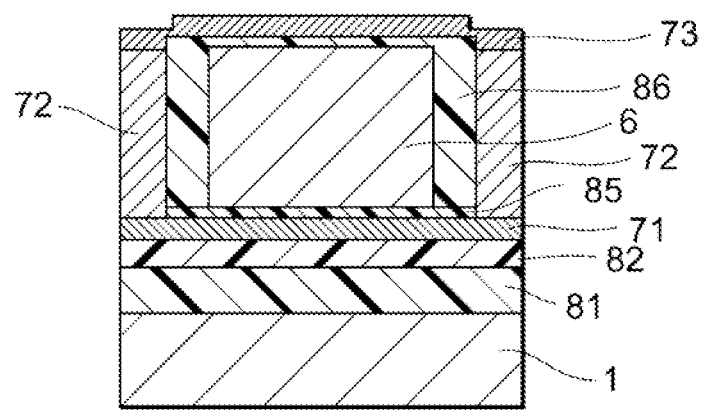
FIG. 5 is a sectional view taken along a line C-C in FIG. 1.
Figure 6:
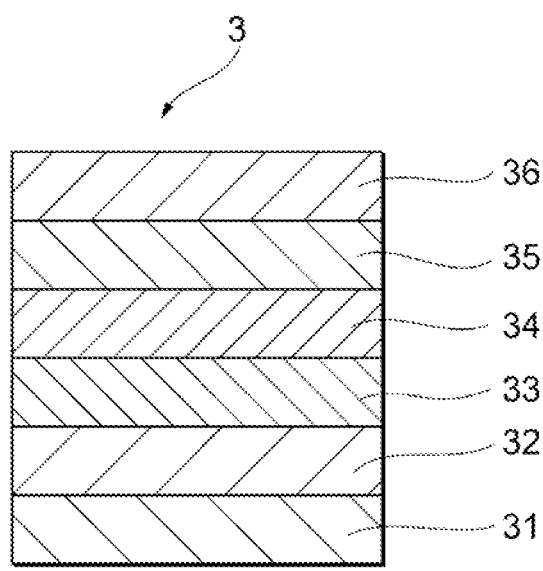
FIG. 6 illustrates a detailed multilayer structure of a magnetoresistive effect film 3 illustrated in FIG. 1.

To start with, the structure of a magnetic element 10 according to a first embodiment of the present invention will be described with reference to FIGS. 1 to 6. FIG. 1 is a plan view of the magnetic element 10. FIG. 2 is a sectional view taken along a line A-A in FIG. 1. FIG. 3 illustrates, in detail, individual portions of an insulating layer 8 illustrated in FIG. 2. FIG. 4 is a sectional view taken along a line B-B in FIG. 1. FIG. 5 is a sectional view taken along a line C-C in FIG. 1. FIG. 6 illustrates a detailed multilayer structure of a magnetoresistive effect film 3 illustrated in FIG. 1. In FIG. 1, some of components that are not important in understanding the present invention are omitted.

As illustrated in FIG. 1, the magnetic element 10 includes four first soft magnetic layers 4 being each in the form of a flat plate and disposed in opposing relation in each of an X-axis direction and a Y-axis direction with the magnetoresistive effect film 3 interposed between the opposing first soft magnetic layers, coils 7 that function as magnetic field generation sources using currents, and a ring-shaped second soft magnetic layer 6 magnetically connected to the coils 7. A part of each of the first soft magnetic layers 4 and a part of the second soft magnetic layer 6 are disposed to overlap in a stacking direction of the magnetoresistive effect film 3. The coils 7 are each constituted by a lower line 71, a side line 72, and an upper line 73, which are described later. In the following description, the "stacking direction of the magnetoresistive effect film 3" is simply denoted by the "stacking direction" in some cases.

In the magnetic element 10, as illustrated in FIG. 2, a lower electrode layer 2, the magnetoresistive effect film 3, and an upper electrode layer 5 are disposed on a substrate 1 in the mentioned order. The first soft magnetic layers 4 are disposed on both sides of the magnetoresistive effect film 3 in the X-axis direction. Opposing parts of the second soft magnetic layer 6 are disposed on both sides of the upper electrode 5 in the X-axis direction. An insulating layer 8 is disposed between every adjacent two layers.

FIG. 3 illustrates, in detail, individual portions of the insulating layer 8 illustrated in FIG. 2. In the magnetic element 10, as illustrated in FIG. 3, an insulating layer 81, an insulating layer 83, an insulating layer 84, an insulating layer 85, an insulating layer 86, and an insulating layer 87 are disposed over the substrate 1.

In the magnetic element 10, as illustrated in FIG. 4, the insulating layer 81, an insulating layer 82, the insulating layer 83, the first soft magnetic layer 4, the insulating layer 84, the lower line 71, the insulating layer 85, the second soft magnetic layer 6, the insulating layer 86, and the upper line 73 are disposed over the substrate 1.

In the magnetic element 10, as illustrated in FIG. 5, the insulating layer 81, the insulating layer 82, the lower line 71, the insulating layer 85, the side line 72, the second soft magnetic layer 6, the insulating layer 86, and the upper line 73 are disposed over the substrate 1.

FIG. 6 illustrates a detailed multilayer structure of the magnetoresistive effect film 3. In the magnetoresistive effect film 3, as illustrated in FIG. 6, a buffer layer 31, an antiferromagnetic layer 32, a magnetic pinned layer 33, a nonmagnetic spacer layer 34, a magnetic free layer 35, and a cap layer 36 are disposed in the mentioned order. In the first embodiment, the magnetic pinned layer 33 corresponds to a first ferromagnetic layer in the present invention, and the magnetic free layer 35 corresponds to a second ferromagnetic layer in the present invention. However, the first ferromagnetic layer and the second ferromagnetic layer in the present invention are not limited to those examples.

The individual layers will be described below.

The substrate 1 is a silicon substrate having a smooth surface. The substrate 1 may be made of another material, such as AlTic ($Al_2O_3.TiC$), glass ($SiO_x$), or carbon (C). Alternatively, a silicon substrate or a glass substrate of which surface has been thermally oxidized in advance may also be used as the substrate 1. Though not illustrated, an insulating layer may be formed on the surface of the substrate 1. Such an insulating layer functions to prevent a possibility that a current may flow into the substrate 1 from the lower electrode layer 2 described later, and that a capacitor component may generate between the substrate 1 and the lower electrode layer 2, thus causing a transmission loss of high-frequency waves. The insulating layer is made of a nonmagnetic insulating material, such as aluminum oxide ($Al_2O_3$) or silicon oxide ($SiO_2$) that is formed by, e.g., the sputtering method or the IBD (ion beam deposition) method. A thickness of the insulating layer is preferably about 0.05 $\mu$m to 10 $\mu$m.

The lower electrode layer 2 serves as one of a pair of electrodes in combination with the upper electrode layer 5. In other words, the lower electrode layer 2 and the upper electrode layer 5 have the function of a pair of electrodes for supplying a current to flow through the magnetoresistive effect film 3 in a direction crossing respective surfaces of the layers constituting the magnetoresistive effect film 3, e.g., in a direction perpendicular to the respective surfaces of the layers constituting the magnetoresistive effect film 3 (i.e., in the stacking direction of the magnetoresistive effect film 3).

The lower electrode layer 2 and the upper electrode layer 5 are each constituted as a film made of Ta, Cu, Au, AuCu, or Ru, or a film made of two or more selected from among those materials, the film being formed by, e.g., the sputtering method or the IBD (ion beam deposition) method. A film thickness of each of the lower electrode layer 2 and the upper electrode layer 5 is preferably about 0.05 $\mu$m to 5 $\mu$m. In the magnetic element 10, the shape of the electrode layer is important for the purpose of reducing the transmission loss. In this embodiment, the lower electrode layer 2 and the upper electrode layer 5 are each specified into the coplanar waveguide (CPW) shape, when looking at the magnetic element 10 from above, by the known photoresist patterning or ion beam etching, for example.

The magnetoresistive effect film 3 is made up of the buffer layer 31, the antiferromagnetic layer 32, the magnetic pinned layer 33, the nonmagnetic spacer layer 34, the magnetic free layer 35, and the cap layer 36. Those layers are each formed by, e.g., a film-forming apparatus with sputtering.

The buffer layer 31 is a layer to cut off crystallinity of the lower electrode layer 2 and to control the orientation and the particle size of the antiferromagnetic layer 32. In particular, the buffer layer 31 is disposed to obtain good exchange coupling between the antiferromagnetic layer 32 and the magnetic pinned layer 33.

The buffer layer 31 is preferably formed of, e.g., a film of Ta and NiCr, or a film of Ta and Ru. A film thickness of the buffer layer 31 is preferably about 2 nm to 6 nm, for example.

The antiferromagnetic layer 32 is a layer aiming to apply unidirectional magnetic anisotropy to the magnetic pinned layer 33 through exchange coupling with respect to the magnetic pinned layer 33.

The antiferromagnetic layer 32 is made of an antiferromagnetic material containing, for example, at least one element selected from a group consisting of Pt, Ru, Rh, Pd, Ni, Cu, Ir, Cr and Fe, in addition to Mn. More specifically, RuRhMn, FeMn, IrMn, PtMn, NiMn, PtRhMn, etc. are examples of the antiferromagnetic material. The content of Mn is preferably 35 at % to 95 at %. A film thickness of the antiferromagnetic layer 32 is preferably about 4 nm to 30 nm.

As a layer for pinning a magnetization direction of the magnetic pinned layer 33, a hard magnetic layer made of a hard magnetic material, such as CoPt, may be disposed instead of the antiferromagnetic layer 32.

While FIG. 6 illustrates the embodiment in which the antiferromagnetic layer 32 is formed on the bottom side (i.e., the side closer to the lower electrode layer 2), the antiferromagnetic layer 32 may be formed on the top side (i.e., the side closer to the cap layer 36) in another embodiment such that positions of the magnetic free layer 35 and the magnetic pinned layer 33 are interchanged.

The magnetic pinned layer 33 is formed on the antiferromagnetic layer 32 that develops the pinning action. In a preferred form, the magnetic pinned layer 33 constitutes the so-called synthetic pinned layer having a structure in which an outer layer, a nonmagnetic intermediate layer, and an inner layer, those layers being not illustrated, are successively stacked from the side close to the antiferromagnetic layer 32.

Each of the outer layer and the inner layer has a structure including a ferromagnetic layer that is made of a ferromagnetic material containing Co or Fe, for example. The outer layer and the inner layer are coupled antiferromagnetically such that their magnetization directions are pinned in a state reversed to each other.

Preferably, each of the outer layer and the inner layer is made of, e.g., a CoFe alloy, or it has a multilayer structure made of CoFe alloys having different compositions or a multilayer structure made of a CoFeB alloy and a CoFe alloy. Preferably, a film thickness of the outer layer is about 1 nm to 7 nm, and a film thickness of the inner layer is about 1 nm to 10 nm. The inner layer may contain a Heusler alloy.

The nonmagnetic intermediate layer is made of a nonmagnetic material that contains, for example, at least one selected from a group consisting of Ru, Rh, Ir, Re, Cr, Zr and Cu. A film thickness of the nonmagnetic intermediate layer is about 0.35 nm to 1.0 nm, for example. The nonmagnetic intermediate layer is disposed to pin magnetization of the inner layer and magnetization of the outer layer such that directions of both the magnetizations are revered to each other. The expression "directions of the magnetizations are revered to each other" is not to be construed in a limitative sense of narrowing the scope of the invention only to the case where the two magnetizations are different by 180° from each other, and it is to be construed in a broader sense involving the case where the two magnetizations are different by 180°±20° from each other.

The nonmagnetic spacer layer 34 is a layer for making the magnetization of the magnetic pinned layer 33 and the magnetization of the magnetic free layer 35 interact to develop the magnetoresistive effect.

The nonmagnetic spacer layer 34 is made of, e.g., an insulator, a semiconductor, or a conductor.

When an insulator is employed as the nonmagnetic spacer layer 34, the insulator is, e.g., $Al_2O_3$ or magnesium oxide (MgO). Preferably, the lattice constant of the nonmagnetic spacer layer 34 and the lattice constant of the magnetic pinned layer 33 are as close as possible to each other, and the lattice constant of the nonmagnetic spacer layer 34 and the lattice constant of the magnetic free layer 35 are also as close as possible to each other. As a result, a coherent tunneling effect is developed through the nonmagnetic spacer layer 34, and a higher magnetoresistance change rate can be obtained. A film thickness of the insulator is preferably about 0.5 nm to 3.0 nm.

When a semiconductor is employed as the nonmagnetic spacer layer 34, the nonmagnetic spacer layer 34 preferably has a structure in which a first nonmagnetic metal layer, a semiconductor oxide layer, and a second nonmagnetic metal layer are successively stacked from the side close to the magnetic pinned layer 33. A material of the first nonmagnetic metal layer is, e.g., Cu or Zn. A film thickness of the first nonmagnetic metal layer is preferably about 0.1 nm to 1.2 nm. A material of the semiconductor oxide layer is, e.g., zinc oxide (ZnO), indium oxide ($In_2O_3$), tin oxide ($SnO_2$), Indium Tin Oxide (ITO), or gallium oxide ($GaO_x$ or $Ga_2O_x$). A film thickness of the semiconductor oxide layer is preferably about 1.0 nm to 4.0 nm. A material of the second nonmagnetic metal layer is, e.g., Zn, an alloy of Zn and Ga, a film of Zn and GaO, Cu, or an alloy of Cu and Ga. A film thickness of the second nonmagnetic metal layer is preferably about 0.1 nm to 1.2 nm.

When a conductor is employed as the nonmagnetic spacer layer 34, a material of the nonmagnetic spacer layer 34 is, e.g., Cu or Ag. A film thickness of the conductor is preferably about 1 nm to 4 nm.

The magnetic free layer 35 is a layer in which the magnetization direction is changed depending on an external magnetic field or a spin polarized electron.

In the case of selecting a material that has an easy magnetization axis in the direction of a film surface, the magnetic free layer 35 is constituted as a film made of, e.g., CoFe, CoFeB, CoFeSi, CoMnGe, CoMnSi or CoMnAl and having a thickness of about 1 nm to 10 nm, for example. A soft magnetic film made of NiFe and having a thickness of 1 nm to 9 nm, for example, may be added as a magnetostriction adjustment layer to the above-mentioned film.

In the case of selecting a material that has an easy magnetization axis in the direction normal to a film surface, the magnetic free layer 35 is made of, e.g., Co, a multilayer film of Co/nonmagnetic layer, a CoCr-based alloy, a Co multilayer film, a CoCrPt-based alloy, a FePt-based alloy, a SmCo-based alloy containing a rare earth, a TbFeCo alloy, or an Heustler alloy.

A highly spin-polarized material may be inserted between the magnetic free layer 35 and the nonmagnetic spacer layer 34. A higher magnetoresistance ratio can be obtained with the insertion of the highly spin-polarized material.

The highly spin-polarized material is, e.g., a CoFe alloy or a CoFeB alloy. A film thickness of a layer of the highly spin-polarized material is preferably 0.2 nm or more and 1 nm or less.

Furthermore, an induced magnetic anisotropy may be introduced to the magnetic free layer 35 by applying a constant magnetic field in the direction perpendicular to its film surface when the magnetic free layer 35 is formed.

The cap layer 36 is a layer aiming to protect the magnetic free layer 35 from oxidation, etching, and so on. The cap layer 36 is preferably formed of, e.g., a Ru film, a Ta film, or a multilayer film of Ru and Ta, and a film thickness of the cap layer 36 is preferably about 2 nm to 10 nm.

After forming the cap layer 36, annealing is performed to pin the magnetization of the magnetic pinned layer 33. The annealing is preferably performed at a degree of vacuum of $1.0 \times 10^{-3}$ Pa or less and temperature of 250° C. to 300° C. for a time of 1 hour to 5 hours under an applied magnetic field of 3 kOe to 10 kOe.

After the annealing, the known photoresist patterning, ion beam etching, etc. are optionally performed for patterning of the plan-view shape of the magnetoresistive effect film 3, when viewed from above, into a circular, elliptic, or rectangular shape. A size of the plan-view shape is preferably 100 nm or less.

The first soft magnetic layer 4 is a layer that is magnetically coupled to the second soft magnetic layer 6 described later, and that takes in magnetic flux released from the second soft magnetic layer 6 and concentrates the magnetic flux, thereby applying the desired magnetic field to the magnetoresistive effect film 3.

The first soft magnetic layer 4 is preferably made of a soft magnetic material that has good soft magnetic characteristics, and that is formed by, e.g., the sputtering method or the IBD method. Examples of the soft magnetic material include NiFe alloys such as NiFe, CoNiFe, NiFeX (X=Ta, Nb, Mo), a FeCo alloy, CoZrNb, CoAl—O, Fe—$SiO_2$, and CoFeB. The saturation magnetic flux density of the first soft magnetic layer 4 is preferably larger than that of the second soft magnetic layer 6. As a result, the first soft magnetic layer 4 can take in the magnetic flux generated from the second soft magnetic layer 6 in a larger amount, and a magnetic field applied from the first soft magnetic layer 4 to the magnetoresistive effect film 3 can be further intensified. A ferromagnetic substance has a tendency that, as the saturation magnetic flux density increases, the coercive force also increases. If the saturation magnetic flux density of the second soft magnetic layer 6 is increased to a level comparable to that of the first soft magnetic layer 4, the coercive force in an entire magnetic path constituted by the first soft magnetic layer 4 and the second soft magnetic layer 6 would be increased, and soft magnetic characteristics of the entire magnetic path would be reduced greatly. By setting the saturation magnetic flux density of the first soft magnetic layer 4 to be larger than that of the second soft magnetic layer 6 and setting the coercive force of the second soft magnetic layer 6 to be smaller than that of the first soft magnetic layer 4, a larger amount of magnetic flux can be taken into the first soft magnetic layers 4 while an increase of the coercive force in the entire magnetic path is suppressed. Thus, the magnetic field applied from the first soft magnetic layer 4 to the magnetoresistive effect film 3 can be further intensified. A film thickness of the first soft magnetic layer 4 is preferably about 5 nm to 30 nm.

Dimensions specified for the first soft magnetic layer 4 will be described below with reference to FIG. 7.

Figure 7:
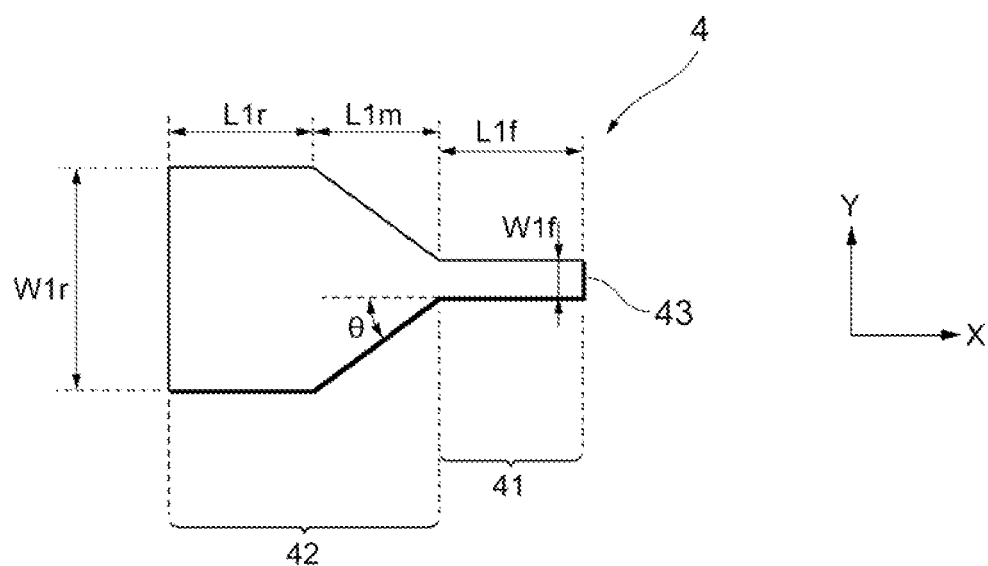
FIG. 7 is a plan view of a first soft magnetic layer 4 illustrated in FIG. 1.

FIG. 7 is a plan view of the first soft magnetic layer 4. The first soft magnetic layer 4 is constituted by a first soft magnetic layer fore-end region 41 and a first soft magnetic layer rear-end region 42. A fore end 43 of the first soft magnetic layer 4 is a fore end of the first soft magnetic layer fore-end region 41. Dimensions of a plan-view shape of the first soft magnetic layer 4 are described here in connection with an example of the first soft magnetic layer 4 in which the first soft magnetic layer fore-end region 41 and the first soft magnetic layer rear-end region 42 are arrayed in the X-axis direction as illustrated in FIG. 7. The first soft magnetic layer rear-end region 42 includes a zone where its length in the Y-direction gradually reduces toward the first soft magnetic layer fore-end region 41. Assume that a length of the relevant zone in the X-direction is L1m, and an angle of a side surface of the relevant zone with respect to the X-direction is θ. Preferably, L1m is about 0.1 μm to 10 μm, and the angle θ is about 10° to 80°. As a result, magnetic flux can be concentrated in the first soft magnetic layer rear-end region 42. Furthermore, assume that a length resulting from subtracting L1m from an X-directional length of the first soft magnetic layer rear-end region 42 is L1r. L1r may be 0 in some cases. Moreover, assume that an X-directional width of the first soft magnetic layer fore-end region 41 is L1f, and a Y-directional length of the first soft magnetic layer fore-end region 41 is W1f. Preferably, L1f is about 0.1 μm to 5 μm, and W1f is about 0.01 μm to 5 μm. As a result, the magnetic flux concentrated in the first soft magnetic layer rear-end region 42 can be propagated to the first soft magnetic layer fore-end region 41 without being attenuated.

A positional relationship between the magnetoresistive effect film 3 and the first soft magnetic layers 4 will be described in detail below.

Figure 8:
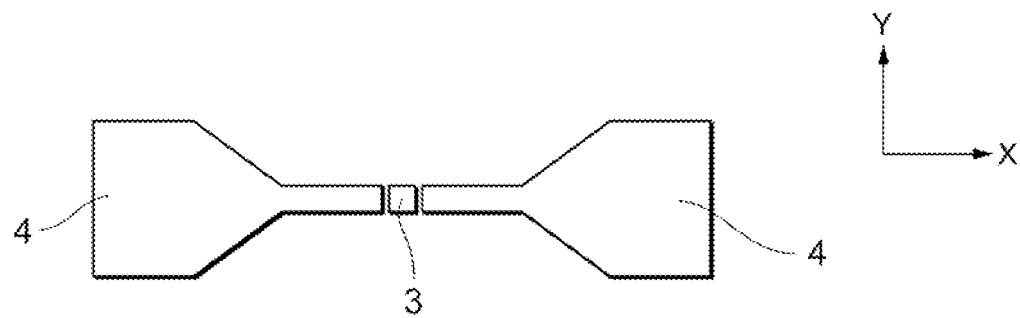
FIG. 8 is a plan view illustrating another example of layout of the first soft magnetic layers 4.
Figure 9:
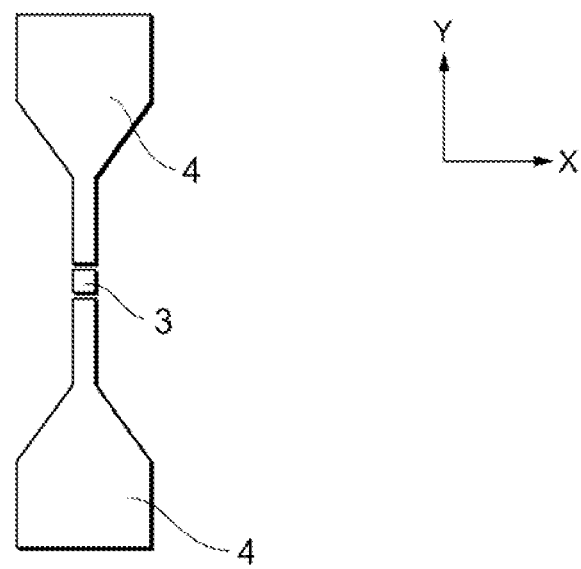
FIG. 9 is a plan view illustrating still another example of layout of the first soft magnetic layers 4.
Figure 10:
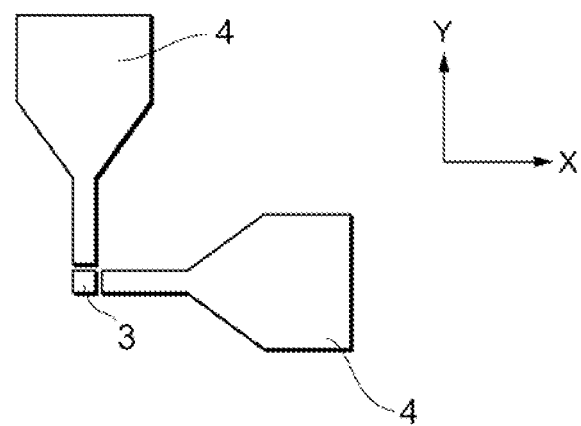
FIG. 10 is a plan view illustrating still another example of layout of the first soft magnetic layers 4.

The magnetoresistive effect film 3 is disposed between respective fore ends 43 of at least two first soft magnetic layers 4. On that occasion, a spacing distance between the fore end 43 of each of the first soft magnetic layers 4 and the magnetoresistive effect film 3 is preferably 50 nm or less. As a result, the magnetic field of sufficient intensity can be applied to the magnetoresistive effect film from the first soft magnetic layers 4. The first soft magnetic layers 4 may be arranged, for example, in two pairs as illustrated in FIG. 1, in one pair opposing to each other in the X-axis direction as illustrated in FIG. 8, in one pair opposing to each other in the Y-axis direction as illustrated in FIG. 9, or one for each of the X-axis direction and the Y-axis direction as illustrated in FIG. 10. In this specification, when the magnetoresistive effect film 3 is disposed in a state that a magnetic field between the respective fore ends 43 of the two first soft magnetic layers 4, such a state is regarded as implying that "the magnetoresistive effect film is disposed between respective fore ends of two first soft magnetic layers". The magnetic element 10 illustrated in FIG. 1 is a preferred form when the direction of applying the magnetic field to the magnetoresistive effect film 3 is to be optionally set to a desired direction in an XY-plane. In that case, for example, the direction of applying the magnetic field can be set to a direction optimum for increasing a spin torque oscillation output of the magnetoresistive effect film 3. On the other hand, FIGS. 8, 9 and 10 represent preferred forms when the direction of applying the magnetic field to the magnetoresistive effect film 3 is to be restrictively set to a certain particular direction in an XY-plane.

Figure 11:
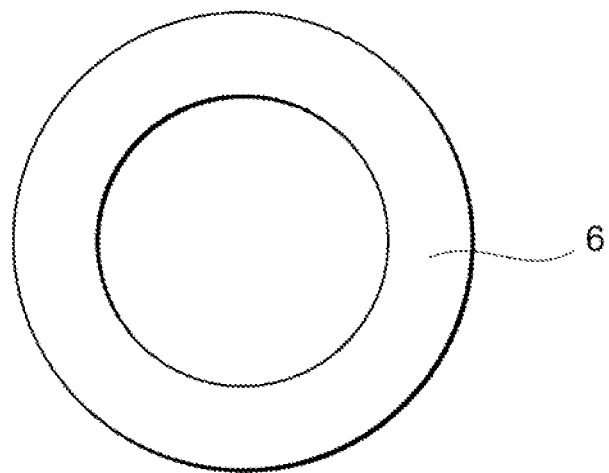
FIG. 11 is a plan view illustrating another example of layout of a second soft magnetic layer 6.
Figure 12:
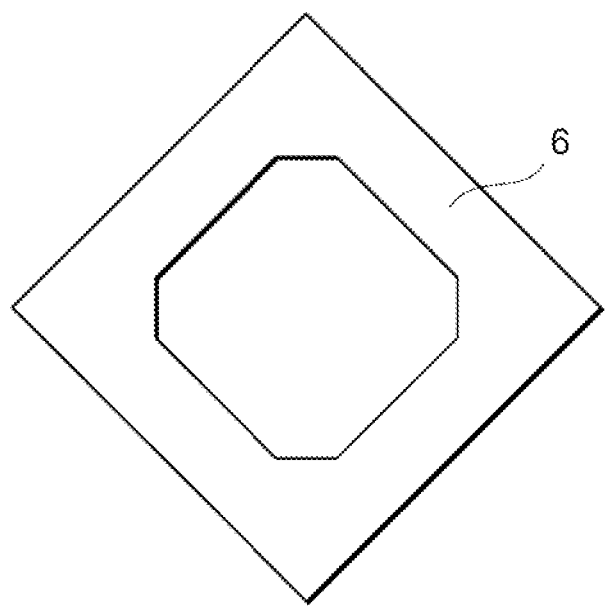
FIG. 12 is a plan view illustrating still another example of layout of the second soft magnetic layer 6.

The second soft magnetic layer 6 is a layer to guide the magnetic flux generated from the coils 7, described later, to the first soft magnetic layers 4. A film thickness of the second soft magnetic layer 6 is larger than that of the first soft magnetic layer 4. The second soft magnetic layer 6 has a ring-like shape in a plan view, which is defined by a continuously extending soft magnetic substance. Because of having the ring-like shape, the second soft magnetic layer 6 can suppress the magnetic flux therein from leaking to the outside. Here, the expression "ring-like shape" is not limited to a rhombic shape illustrated in FIG. 1, and it may be, for example, a circular shape illustrated in FIG. 11 or a shape, illustrated in FIG. 12, resulting from forming an inner periphery of a magnetic path in the second soft magnetic layer 6 to have corners formed with obtuse angles. By employing such a shape, magnetic resistance of the second soft magnetic layer 6 can be reduced, and an amount of current to be supplied to each coil 7 to obtain the desired magnetic flux can be reduced.

A spacing distance between the second soft magnetic layer 6 and the magnetoresistive effect film 3 is larger than that between the first soft magnetic layer 4 and the magnetoresistive effect film 3. As a result, the film thickness of the second soft magnetic layer 6 can be set to a sufficiently large value, and the magnetic flux generated from the coils 7, described later, can be propagated in a larger amount to the second soft magnetic layer 6. Moreover, a part of each of at least two first soft magnetic layers 4 overlaps a part of the second soft magnetic layer 6 in the stacking direction of the magnetoresistive effect film 3, whereby the first soft magnetic layer 4 and the second soft magnetic layer 6 are magnetically coupled to each other. As a result, the magnetic flux generated in the second soft magnetic layer 6 can be propagated to the first soft magnetic layer 4. By dividing a propagation path of the magnetic flux generated from the coil 7 into the first soft magnetic layer 4 and the second soft magnetic layer 6 as described above, a magnetic path length of the first soft magnetic layer 4 having a comparatively small film thickness can be shortened. Thus, an amount of attenuation of the magnetic flux in the first soft magnetic layer 4 is reduced, and the magnetic field can be generated at sufficient intensity from the first soft magnetic layer 4.

The second soft magnetic layer 6 is preferably made of a soft magnetic material that has good soft magnetic characteristics, and that is formed by, e.g., the sputtering method, the IBD method, or the frame plating method. Examples of the soft magnetic material include NiFe alloys such as NiFe, NiFeCo, NiFeX (X=Ta, Nb, Mo), a FeCo alloy, CoZrNb, CoAl—O, Fe—$SiO_2$, and CoFeB. A film thickness of the second soft magnetic layer 6 is preferably about 0.1 µm to 10 µm. As a result, the desired magnetic flux can be generated inside the second soft magnetic layer 6.

The coils 7 are each constituted by the lower line 71, the side line 72, and the upper line 73, and each coil serves as a magnetic field generation source using a current, i.e., a source for generating magnetic flux upon application of a current thereto. In the magnetic element 10, as illustrated in FIG. 1, four coils 7 are wound around the second soft magnetic layer 6 such that a part of the second soft magnetic layer 6, the part being present between the adjacent coils 7, overlaps a part of corresponding one of the first soft magnetic layers 4 (specifically, a part of corresponding one of the first soft magnetic layer rear-end regions 42 thereof) in the stacking direction of the magnetoresistive effect film 3.

The lower line 71, the side line 72, and the upper line 73 are made of a highly conductive material, such as Au, Cu or AuCu, and are formed by, e.g., the sputtering method, the IBD method, or the frame plating method. The lower line 71, the side line 72, and the upper line 73 are not necessarily made of the same material insofar as the desire conductivity is ensured in each line. The side line 72 may be made of the same material as that of the second soft magnetic layer 6. In that case, since the side line 72 and the second soft magnetic layer 6 can be fabricated at the same time, the manufacturing process can be simplified. A film thickness of each of the lower line 71, the side line 72, and the upper line 73 is preferably about 0.1 µm to 10 µm. As a result, conductivity of the coil 7 can be set to a high value. The coil 7 has a structure wound around the second soft magnetic layer 6 (i.e., a spiral structure). The number of windings (number of turns) of the coil 7 can be set optionally.

The insulating layer 8 is constituted as the insulating layer 81, the insulating layer 82, the insulating layer 83, the insulating layer 84, the insulating layer 85, the insulating layer 86, and the insulating layer 87, and it serves as a layer to ensure electrical insulation between every adjacent two of the above-described layers.

The insulating layer 8 is made of a nonmagnetic insulating material, which is formed by, e.g., the sputtering method, the IBD method, or the coating method, such as $Al_2O_3$, $SiO_2$, a photoresist, or Spin On Glass (SOG), the latter two exhibiting fluidity when heated. The insulating layer 8 may be formed by using two or more selected from the above-mentioned nonmagnetic insulating materials. A film thickness of the insulating layer 8 is preferably about 0.005 µm to 10 µm. After forming the insulating layer 8, a planarizing process may be performed by the chemical machining polishing (CMP) to improve film flatness.

Patterning of each layer is performed by, e.g., the known photoresist patterning, ion beam etching, or lift-off method.

Control of currents supplied to the coils 7 (control of a direction of magnetic flux generated from each coil 7) and spin torque oscillation will be described below.

First, the control of the currents supplied to the coils 7 is described with reference to FIG. 13.

Figure 13:
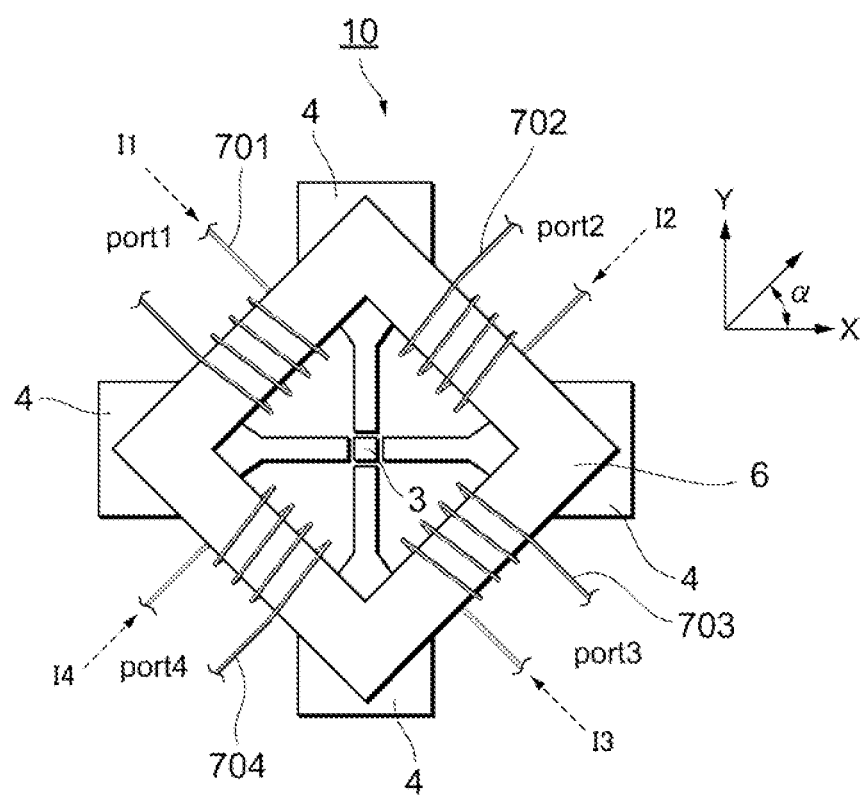
FIG. 13 is an illustration to explain control of currents supplied to coils.

As illustrated in FIG. 13, four coils 701, 702, 703 and 704 included in the magnetic element 10 are connected to four independent control lines denoted by port1, port2, port3, and port4, respectively. Assume here that a current supplied to the coil 701 is I1, a current supplied to the coil 702 is I2, a current supplied to the coil 703 is I3, and a current supplied to the coil 704 is I4. Also, assume that when a current is supplied to flow in a direction denoted by each of dotted-line arrows illustrated in FIG. 13 and later-described FIGS. 24 to 27, the relevant current is a positive (+) current, and that when a current is supplied to flow in a direction reversed to the direction denoted by each of the dotted-line arrows, the relevant current is a negative (−) current. Furthermore, assume, regarding a direction of magnetic flux generated in the ring-shaped second soft magnetic layer 6 from each of the four coils 701, 702, 703 and 704, that the direction of the magnetic flux is a +direction when the direction of the current supplied to the coil is + (i.e., when the direction of the magnetic flux is counterclockwise in the second soft magnetic layer 6 in FIG. 13 and later-described FIGS. 24 to 27), and that the direction of the magnetic flux is a −direction when the direction of the current supplied to the coil is − (i.e., when the direction of the magnetic flux is clockwise in the second soft magnetic layer 6 in FIG. 13 and later-described FIGS. 24 to 27). Moreover, assume that an angle formed between the direction of applying the magnetic field and the X-axis in an XY-plane is α. Here, materials, shapes, and dimensions of the individual portions of the first soft magnetic layers 4 are assumed to be all the same. In addition, materials, shapes, dimensions, and the number of turns of the coils 701, 702, 703 and 704 are assumed to be all the same.

In order to apply the magnetic field of sufficient intensity to the magnetoresistive effect film 3, currents are supplied to at least two of the four independent coils 701, 702, 703 and 704 such that the direction of the magnetic flux generated in the second soft magnetic layer 6 from one of the at least two coils is reversed to the direction of the magnetic flux generated in the second soft magnetic layer 6 from at least another one coil.

For example, when the magnetic field is to be applied to the magnetoresistive effect film 3 in a direction of α=0°, the control may be performed, for example, such that the current direction is set to the +direction for I1 and I2 and to the −direction for I3 and I4, and that the current amount is set to the same value for I1, I2, I3 and I4. In that case, the direction of the magnetic flux generated in the second soft magnetic layer 6 from the coils 701 and 702 is the +direction, and the direction of the magnetic flux generated in the second soft magnetic layer 6 from the coils 703 and 704 is the −direction, whereby the magnetic flux flows as denoted by one-dot-chain line arrows in FIG. 24. Thus, in the above-mentioned case, the magnetic flux flows from a part of the first soft magnetic layer 4, the part overlapping the part of the second soft magnetic layer 6 between the coil 701 and the coil 704 in the stacking direction, to a part of the first soft magnetic layer 4, the part overlapping the part of the second soft magnetic layer 6 between the coil 702 and the coil 703 in the stacking direction. As a result, the magnetic field is applied to the magnetoresistive effect film 3 in the direction of α=0°.

When the magnetic field is to be applied to the magnetoresistive effect film 3 in a direction of α=45°, the control may be performed, for example, such that the current direction is set to the +direction for I1 and to the −direction for I3, and that the current amount is set to the same value for I1 and I3 and to 0 for I2 and I4. In that case, the direction of the magnetic flux generated in the second soft magnetic layer 6 from the coil 701 is the +direction, and the direction of the magnetic flux generated in the second soft magnetic layer 6 from the coil 703 is the −direction, whereby the magnetic flux flows as denoted by one-dot-chain line arrows in FIG. 25. Thus, in the above-mentioned case, the magnetic flux flows from a part of the first soft magnetic layer 4, the part overlapping the part of the second soft magnetic layer 6 between the coil 701 and the coil 704 in the stacking direction, to a part of the first soft magnetic layer 4, the part overlapping the part of the second soft magnetic layer 6 between the coil 702 and the coil 703 in the stacking direction, and to a part of the first soft magnetic layer 4, the part overlapping the part of the second soft magnetic layer 6 between the coil 701 and the coil 702 in the stacking direction. Furthermore, the magnetic flux flows from a part of the first soft magnetic layer 4, the part overlapping the part of the second soft magnetic layer 6 between the coil 703 and the coil 704 in the stacking direction, to a part of the first soft magnetic layer 4, the part overlapping the part of the second soft magnetic layer 6 between the coil 701 and the coil 702 in the stacking direction, and to a part of the first soft magnetic layer 4, the part overlapping the part of the second soft magnetic layer 6 between the coil 702 and the coil 703 in the stacking direction. As a result, the direction of the magnetic field applied to the magnetoresistive effect film 3 is specified to α=45°.

When the magnetic field is to be applied to the magnetoresistive effect film 3 in the direction of α=45° by another method, the control may be performed, for example, such that the current direction is set to the +direction for I1 and to the −direction for I2, I3 and I4, and that the current amount is set to the same value for I1, I2, I3 and I4. In that case, the direction of the magnetic flux generated in the second soft magnetic layer 6 from the coil 701 is the +direction, and the direction of the magnetic flux generated in the second soft magnetic layer 6 from the coils 702, 703 and 704 is the −direction, whereby the magnetic flux flows as denoted by one-dot-chain line arrows in FIG. 26. Thus, in the above-mentioned case, the magnetic flux flows from a part of the first soft magnetic layer 4, the part overlapping the part of the second soft magnetic layer 6 between the coil 701 and the coil 704 in the stacking direction, to a part of the first soft magnetic layer 4, the part overlapping the part of the second soft magnetic layer 6 between the coil 701 and the coil 702 in the stacking direction. As a result, the direction of the magnetic field applied to the magnetoresistive effect film 3 is specified to α=45°.

Similarly, when the magnetic field is to be applied to the magnetoresistive effect film 3 in a direction of α=90°, the control may be performed such that the current direction is set to the +direction for I1 and I4 and to the −direction for I2 and I3, and that the current amount is set to the same value for I1, I2, I3 and I4. When the magnetic field is to be applied to the magnetoresistive effect film 3 in a direction of α=135°, the control may be performed such that the current direction is set to the −direction for I2 and to the +direction for I4, and that the current amount is set to the same value for I2 and I4 and to 0 for I1 and I3. When the magnetic field is to be applied to the magnetoresistive effect film 3 in a direction of α=180°, the control may be performed such that the current direction is set to the −direction for I1 and I2 and to the +direction for I3 and I4, and that the current amount is set to the same value for I1, I2, I3 and I4. Moreover, when the magnetic field is to be applied to the magnetoresistive effect film 3 in a direction of α=225°, the control may be performed such that the current direction is set to the −direction for I1 and to the +direction for I3, and that the current amount is set to the same value for I1 and I3 and to 0 for I2 and I4. When the magnetic field is to be applied to the magnetoresistive effect film 3 in a direction of α=270°, the control may be performed such that the current direction is set to the −direction for I1 and I4 and to the +direction for I2 and I3, and that the current amount is set to the same value for I1, I2, I3 and I4. When the magnetic field is to be applied to the magnetoresistive effect film 3 in a direction of α=315°, the control may be performed such that the current direction is set to the +direction for I2 and to the −direction for I4, and that the current amount is set to the same value for I2 and I4 and to 0 for I1 and I3.

While the foregoing examples have been described in connection with only the case where the current amounts supplied to the coils 7 are set to the same value except for the case where the current amount is set to 0, the magnetic field in an optional direction can be applied to the magnetoresistive effect film 3 by adjusting the current amounts supplied to the coils 7.

Figure 27:
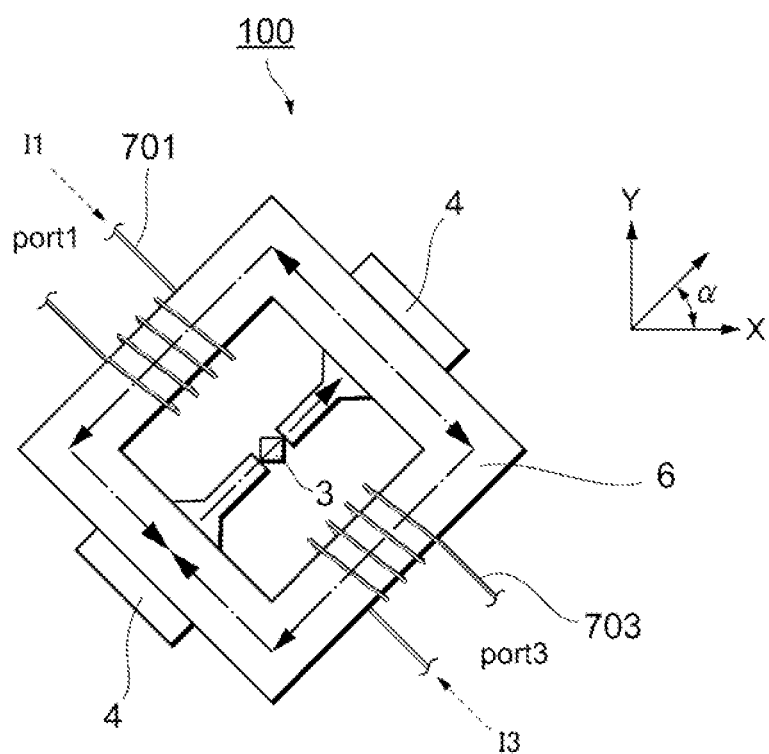
FIG. 27 is an illustration to explain flow of magnetic flux when a magnetic field is applied in a direction of $\alpha=45°$ in a magnetic element 100.

The magnetic field of sufficient intensity can also be applied to the magnetoresistive effect film 3 in a magnetic element 100 illustrated in FIG. 27. In the magnetic element 100, the magnetoresistive effect film 3 is disposed between respective fore ends of two first soft magnetic layers 4, and two coils 701 and 703 are wound around the second soft magnetic layer 6 such that parts of the second soft magnetic layer 6, the parts being present between the two coils 701 and 703, overlap respectively parts of corresponding ones of the first soft magnetic layers 4 (specifically, parts of corresponding ones of the first soft magnetic layer rear-end regions 42 thereof) in the stacking direction of the magnetoresistive effect film 3.

In the above-mentioned case, for example, when the current direction is set to the +direction for I1 and to the −direction for I3, and the current amount is set to the same value for I1 and I3, the direction of the magnetic flux generated in the second soft magnetic layer 6 from the coil 701 is the +direction, and the direction of the magnetic flux generated in the second soft magnetic layer 6 from the coil 703 is the −direction, whereby the magnetic flux flows as denoted by one-dot-chain line arrows in FIG. 27. Thus, in the above-mentioned case, the magnetic flux flows from a part of the first soft magnetic layer 4, the part overlapping one of the parts of the second soft magnetic layer 6 between the coil 701 and the coil 703 in the stacking direction, to a part of the first soft magnetic layer 4, the part overlapping the other one of the parts of the second soft magnetic layer 6 between the coil 701 and the coil 703 in the stacking direction. As a result, the direction of the magnetic field applied to the magnetoresistive effect film 3 is specified to α=45°.

Table 1 lists the relations among a, the direction of the magnetic field generated in the ring-shaped second soft magnetic layer 6 from each coil, and the direction and the amount of the current supplied to each coil.

TABLE 1

| | Direction of Current and Direction of Magnetic Flux | | | | |
|---|---|---|---|---|---|
| α | Coil 701 | Coil 702 | Coil 703 | Coil 704 | Current Amount |
| 0° | + | + | − | − | I1 = I2 = I3 = I4 |
| 45° | + | + | − |   | I1 = I3, I2 = I4 = 0 |
| 45° | + | − | − | − | I1 = I2 = I3 = I4 |
| 90° | + | − | − | + | I1 = I2 = I3 = I4 |
| 135° |   | − |   | + | I2 = I4, I1 = I3 = 0 |
| 180° | − | − | + | + | I1 = I2 = I3 = I4 |
| 225° | − |   | + |   | I1 = I3, I2 = I4 = 0 |
| 270° | − | + | + | − | I1 = I2 = I3 = I4 |
| 315° |   | + |   | − | I2 = I4, I1 = I3 = 0 |

Thus, the magnetic field of sufficient intensity can be applied to the magnetoresistive effect film 3 by setting the direction of the magnetic flux, which is generated in the second soft magnetic layer 6 from one of at least two magnetic field generation sources (coils 7) using currents, to be reversed to the direction of the magnetic flux generated in the second soft magnetic layer 6 from at least another one magnetic field generation source such that the magnetic flux generated from the magnetic field generation sources flows between the at least two first soft magnetic layers 4.

Furthermore, the direction of the magnetic field applied to the magnetoresistive effect film 3 can be changed by employing, as in the magnetic element 10, the arrangement that the four magnetic field generation sources (coils 701 to 704) using currents and the four first soft magnetic layers 4 are disposed, and that a part of the second soft magnetic layer 6, the part being present between the adjacent coils 7, overlaps the part of corresponding one of the first soft magnetic layers 4 in the stacking direction.

The spin torque oscillation output will be described below.

The following is brief description of the spin torque oscillation phenomenon. When a DC current is supplied to the magnetoresistive effect film 3, an electron subjected to spin polarization by the magnetic pinned layer 33 is caused to flow into the magnetic free layer 35, whereby spin torque is transferred and magnetization in the magnetic free layer 35 is going to be reversed. When an external magnetic field is applied in a direction in which torque is generated opposite to the direction of the reversal of the magnetization, large precession of the magnetization is generated when those two reversing torques are brought into the condition of being close to each other, and a high-frequency signal at a frequency corresponding to the period of the precession is output. Such a phenomenon is the spin torque oscillation.

Figure 14:
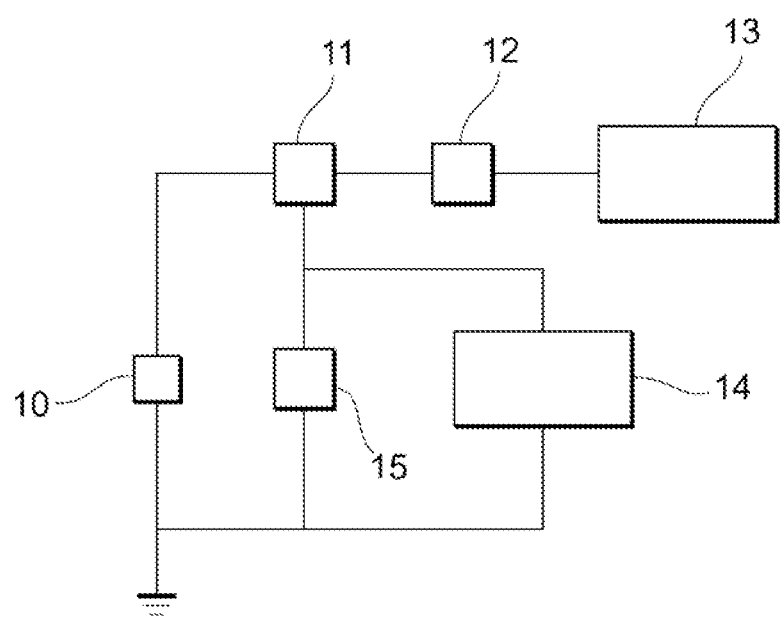
FIG. 14 is a block diagram of a device for measuring an oscillation output.

FIG. 14 is a block diagram of a device for measuring the oscillation output of the magnetic element 10. In FIG. 14, numeral 11 denotes a bias tee that separates an AC signal and a DC signal. Numeral 12 denotes a power amplifier that amplifies the AC signal having been separated by the bias tee 11. Numeral 13 denotes a spectrum analyzer that measures an output of a high-frequency signal having been amplified by the power amplifier 12. Numeral 14 denotes a source meter that applies a current to the magnetoresistive effect film 3. The current applied to the magnetoresistive effect film 3 from the source meter 14 is set in consideration of the breakdown voltage of the magnetic element. Numeral 15 denotes a diode that is connected to prevent damage of the magnetoresistive effect film 3.

By performing the measurement of the spin torque oscillation on the magnetic element 10, an oscillation peak can be obtained near the frequency corresponding to the period of the precession of the magnetization in the magnetic free layer 35.

As described above, the magnetic element 10 includes the magnetoresistive effect film 3 including the nonmagnetic spacer layer 34, a first ferromagnetic layer (magnetic pinned layer 33), and a second ferromagnetic layer (magnetic free layer 35), the first and second ferromagnetic layers being disposed with the nonmagnetic spacer layer 34 interposed therebetween, a pair of electrodes (lower electrode layer 2 and upper electrode layer 5) disposed with the magnetoresistive effect film 3 interposed therebetween in the stacking direction of the magnetoresistive effect film 3, at least two first soft magnetic layers 4, a magnetic field generation source (coil 7) using a current, and the second soft magnetic layer 6 magnetically connected to the magnetic field generation source (coil 7), wherein the second soft magnetic layer 6 has a ring-like shape, the spacing distance between the second soft magnetic layer 6 and the magnetoresistive effect film 3 is larger than the spacing distance between the first soft magnetic layer 4 and the magnetoresistive effect film 3, the film thickness of the second soft magnetic layer 6 is larger than the film thickness of the first soft magnetic layer 4, a part of each of the at least two first soft magnetic layers 4 overlaps a part of the second soft magnetic layer 6 in the stacking direction, the first soft magnetic layers 4 and the second soft magnetic layer 6 are magnetically coupled to each other, and the magnetoresistive effect film 3 is disposed between respective fore ends 43 of the at least two first soft magnetic layers 4. Therefore, the magnetic field of sufficient intensity can be applied to the magnetoresistive effect film 3.

Second Embodiment

Figure 15:
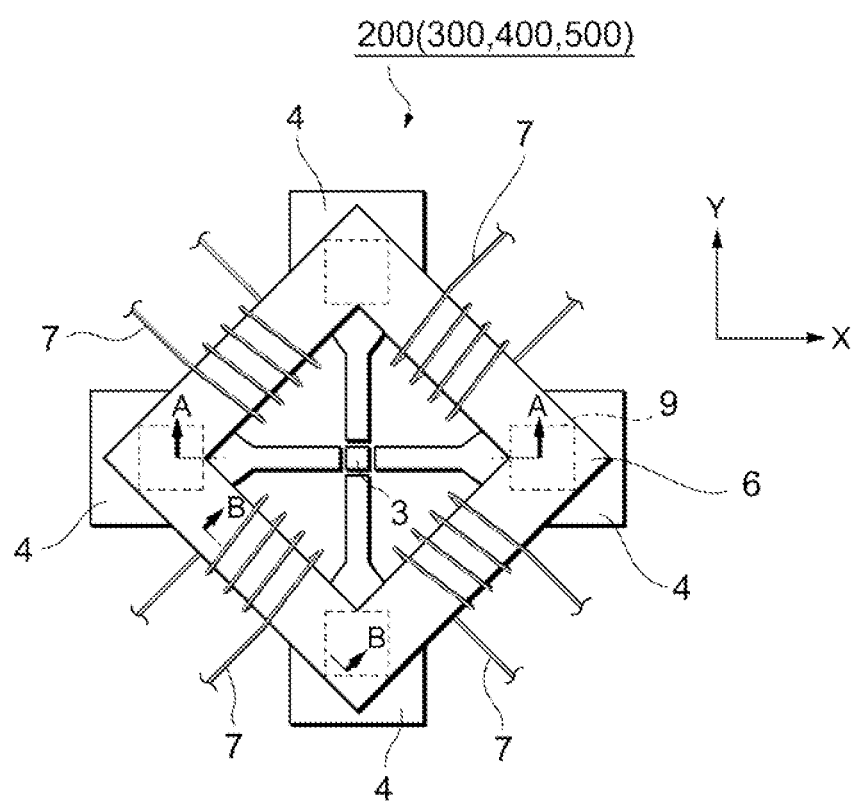
FIG. 15 is a plan view of each of magnetic elements according to second to fifth embodiments of the present invention.
Figure 16:
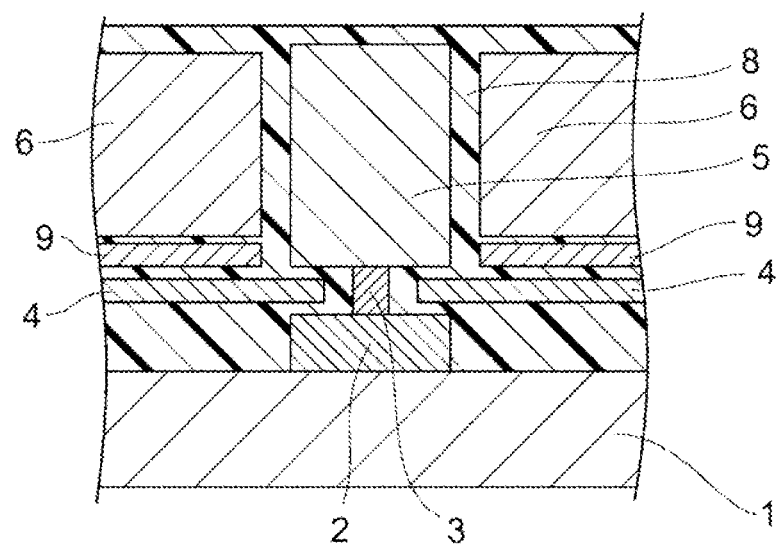
FIG. 16 is a sectional view taken along a line A-A in FIG. 15 according to the second embodiment of the present invention.
Figure 17:
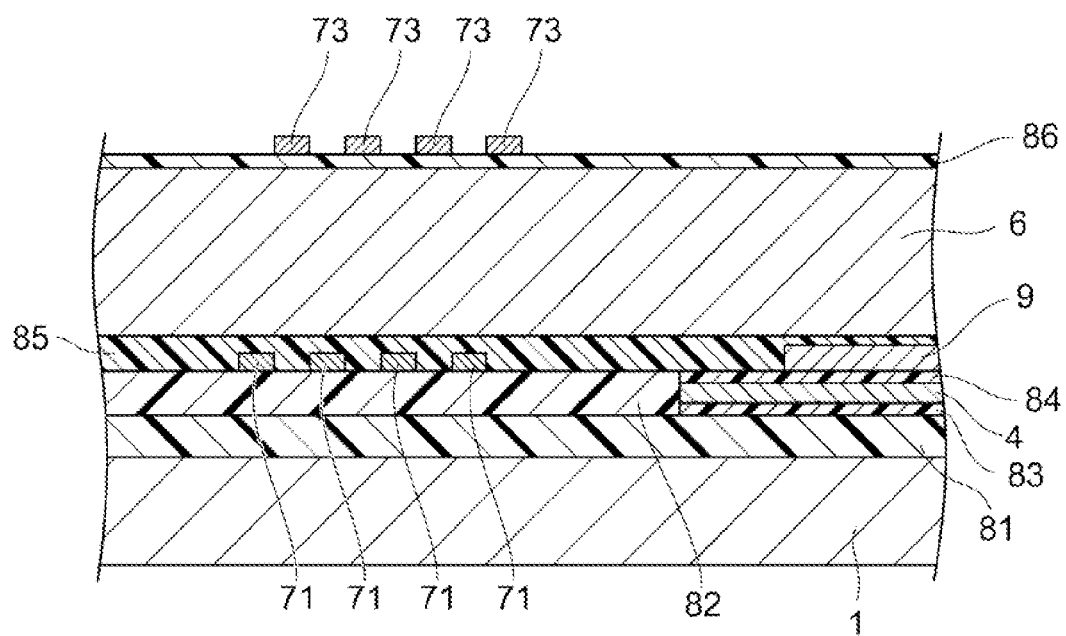
FIG. 17 is a sectional view taken along a line B-B in FIG. 15 according to the second embodiment of the present invention.

A structure of a magnetic element 200 according to a second embodiment of the present invention will be described below with reference to FIGS. 15 to 17. FIG. 15 is a plan view of the magnetic element 200 according to the second embodiment of the present invention, FIG. 16 is a sectional view taken along a line A-A in FIG. 15, and FIG. 17 is a sectional view taken along a line B-B in FIG. 15. In FIG. 15, some of components that are not important in understanding the present invention are omitted. The magnetic element 200 is different from the magnetic element 10 of the first embodiment in that a third soft magnetic layer 9 is disposed between the first soft magnetic layer 4 and the second soft magnetic layer 6.

The third soft magnetic layer 9 is a layer to intensify the magnetic coupling between the first soft magnetic layer 4 and the second soft magnetic layer 6. With the third soft magnetic layer 9 disposed between the first soft magnetic layer 4 and the second soft magnetic layer 6, the magnetic flux generated in the second soft magnetic layer 6 is caused to propagate into the first soft magnetic layer 4 through the third soft magnetic layer 9. As a result, a leakage magnetic field leaking to the outside from the second soft magnetic layer 6 can be reduced. Accordingly, the magnetic field of sufficient intensity can be applied to the magnetoresistive effect film 3.

Furthermore, the saturation magnetic flux density of the first soft magnetic layer 4 is preferably larger than that of the third soft magnetic layer 9. As a result, the first soft magnetic layer 4 can take in the magnetic flux generated from the third soft magnetic layer 9 in a larger amount, and the magnetic field applied from the first soft magnetic layer 4 to the magnetoresistive effect film 3 can be further intensified. A ferromagnetic substance has a tendency that, as the saturation magnetic flux density increases, the coercive force also increases. If the saturation magnetic flux density of the third soft magnetic layer 9 is increased to a level comparable to that of the first soft magnetic layer 4, the coercive force in an entire magnetic path constituted by the first soft magnetic layer 4 and the third soft magnetic layer 9 would be increased, and soft magnetic characteristics of the entire magnetic path would be reduced greatly. By setting the saturation magnetic flux density of the first soft magnetic layer 4 to be larger than that of the third soft magnetic layer 9 and setting the coercive force of the third soft magnetic layer 9 to be smaller than that of the first soft magnetic layer 4, a larger amount of magnetic flux can be taken into the first soft magnetic layers 4 while an increase of the coercive force in the entire magnetic path is suppressed. Thus, the magnetic field applied from the first soft magnetic layer 4 to the magnetoresistive effect film 3 can be further intensified.

The third soft magnetic layer 9 is preferably made of a soft magnetic material that has good soft magnetic characteristics, and that is formed by, e.g., the sputtering method, the IBD method, or the frame plating method. Examples of the soft magnetic material include NiFe alloys such as NiFe, NiFeCo, NiFeX (X=Ta, Nb, Mo), a FeCo alloy, CoZrNb, CoAl—O, Fe—SiO$_2$, and CoFeB. A film thickness of the third soft magnetic layer 9 is preferably about 0.01 μm to 10 μm. As a result, the magnetic coupling between the first soft magnetic layers 4 and the second soft magnetic layer 6 can be intensified.

Patterning of the third soft magnetic layer 9 is performed by, e.g., the known photoresist patterning, ion beam etching, or lift-off method.

Third Embodiment

Figure 18:
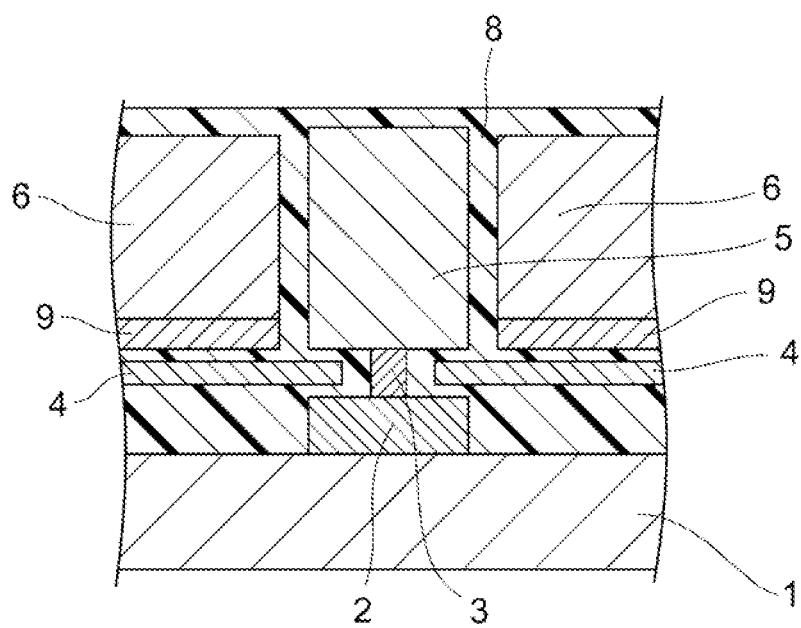
FIG. 18 is a sectional view taken along a line A-A in FIG. 15 according to the third embodiment of the present invention.
Figure 19:
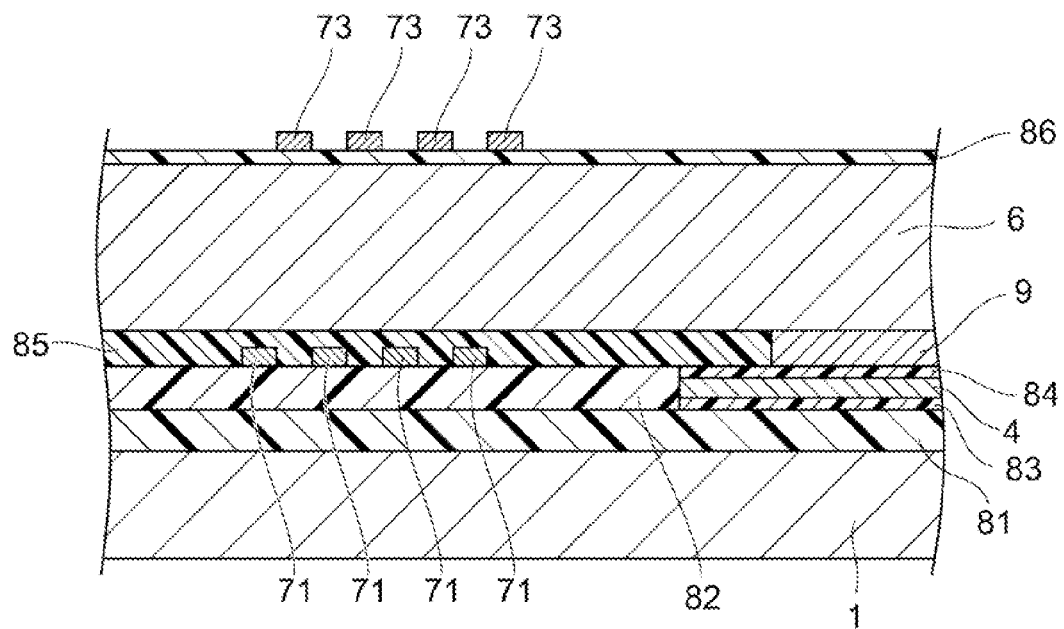
FIG. 19 is a sectional view taken along a line B-B in FIG. 15 according to the third embodiment of the present invention.

A structure of a magnetic element 300 according to a third embodiment of the present invention will be described below with reference to FIGS. 18 and 19. Because a plan view of the magnetic element 300 according to the third embodiment is the same as that illustrated in FIG. 15, the following description is made with reference to FIG. 15 as well. FIG. 18 is a sectional view, taken along the line A-A in FIG. 15, representing the third embodiment, and FIG. 19 is a sectional view, taken along the line B-B in FIG. 15, representing the third embodiment. The magnetic element 300 is different from the magnetic element 200 of the second embodiment in that, while the insulating layer 8 is disposed between the second soft magnetic layer 6 and the third soft magnetic layer 9 in the magnetic element 200 of the second embodiment, the second soft magnetic layer 6 and the third soft magnetic layer 9 are directly connected to each other in the magnetic element 300. As a result, in the magnetic element 300, magnetic coupling between the second soft magnetic layer 6 and the third soft magnetic layer 9 can be intensified in comparison with that in the magnetic element 200 of the second embodiment, and a leakage magnetic field leaking to the outside from the second soft magnetic layer 6 can be reduced. Accordingly, in the magnetic element 300, the magnetic field can be applied to the magnetoresistive effect film 3 at higher intensity than that in the magnetic element 200 of the second embodiment.

Fourth Embodiment

Figure 20:
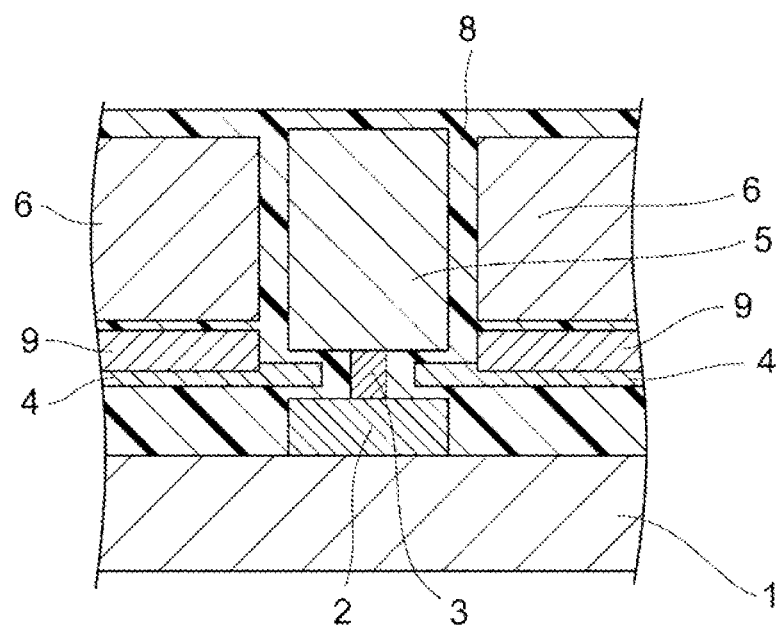
FIG. 20 is a sectional view taken along a line A-A in FIG. 15 according to the fourth embodiment of the present invention.
Figure 21:
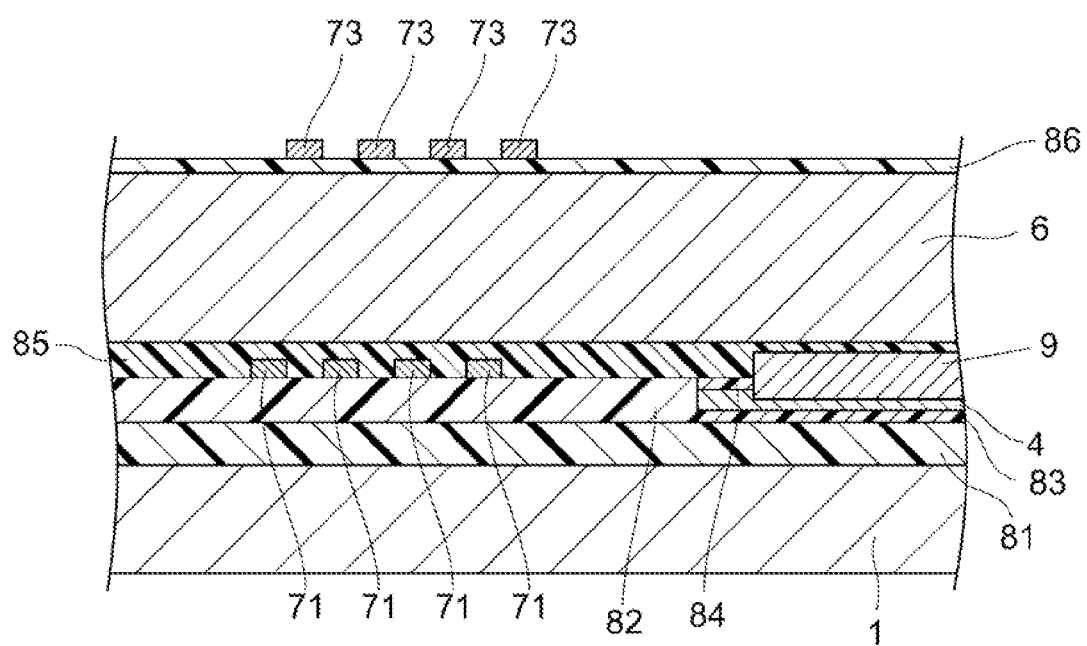
FIG. 21 is a sectional view taken along a line B-B in FIG. 15 according to the fourth embodiment of the present invention.

A structure of a magnetic element 400 according to a fourth embodiment of the present invention will be described below with reference to FIGS. 20 and 21. Because a plan view of the magnetic element 400 according to the fourth embodiment is the same as that illustrated in FIG. 15, the following description is made with reference to FIG. 15 as well. FIG. 20 is a sectional view, taken along the line A-A in FIG. 15, representing the fourth embodiment, and FIG. 21 is a sectional view, taken along the line B-B in FIG. 15, representing the fourth embodiment. The magnetic element 400 is different from the magnetic element 200 of the second embodiment in that, while the insulating layer 8 is disposed between the first soft magnetic layer 4 and the third soft magnetic layer 9 in the magnetic element 200 of the second embodiment, the first soft magnetic layer 4 and the third soft magnetic layer 9 are directly connected to each other in the magnetic element 400. As a result, in the magnetic element 400, magnetic coupling between the first soft magnetic layer 4 and the third soft magnetic layer 9 can be intensified in comparison with that in the magnetic element 200 of the second embodiment, and a leakage magnetic field leaking to the outside from the third soft magnetic layer 9 can be reduced.

Fifth Embodiment

Figure 22:
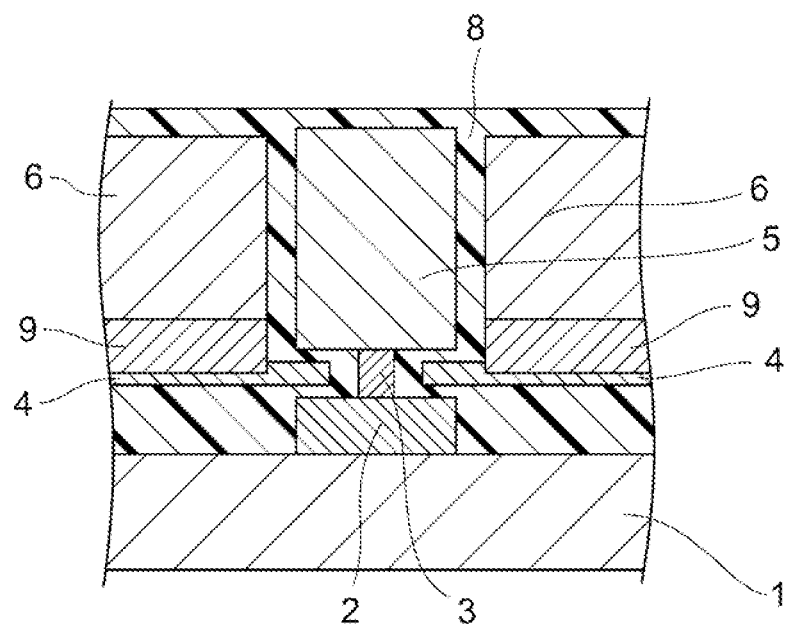
FIG. 22 is a sectional view taken along a line A-A in FIG. 15 according to the fifth embodiment of the present invention.
Figure 23:
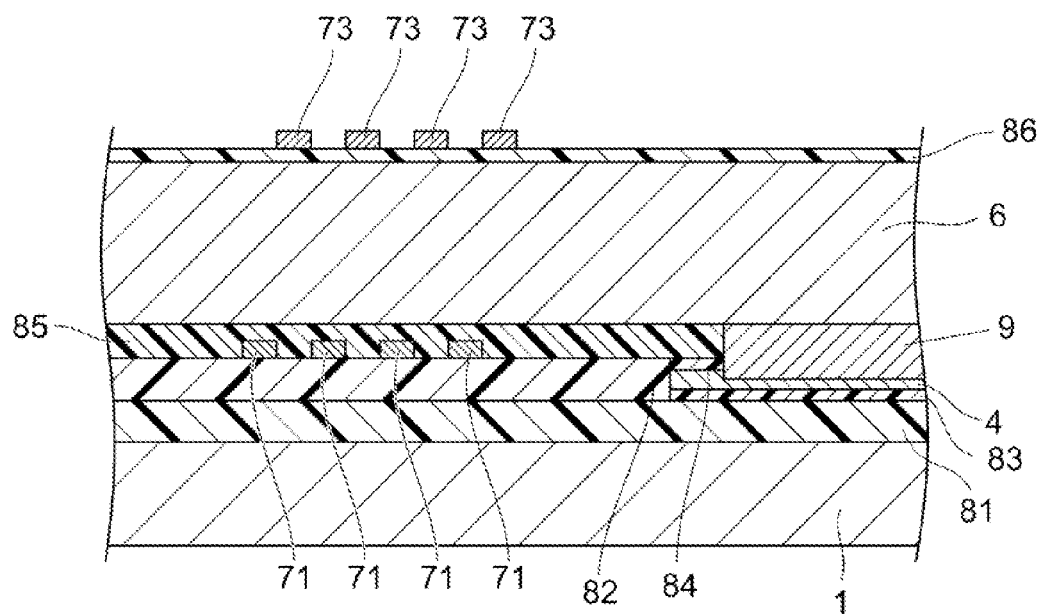
FIG. 23 is a sectional view taken along a line B-B in FIG. 15 according to the fifth embodiment of the present invention.
Figure 24:
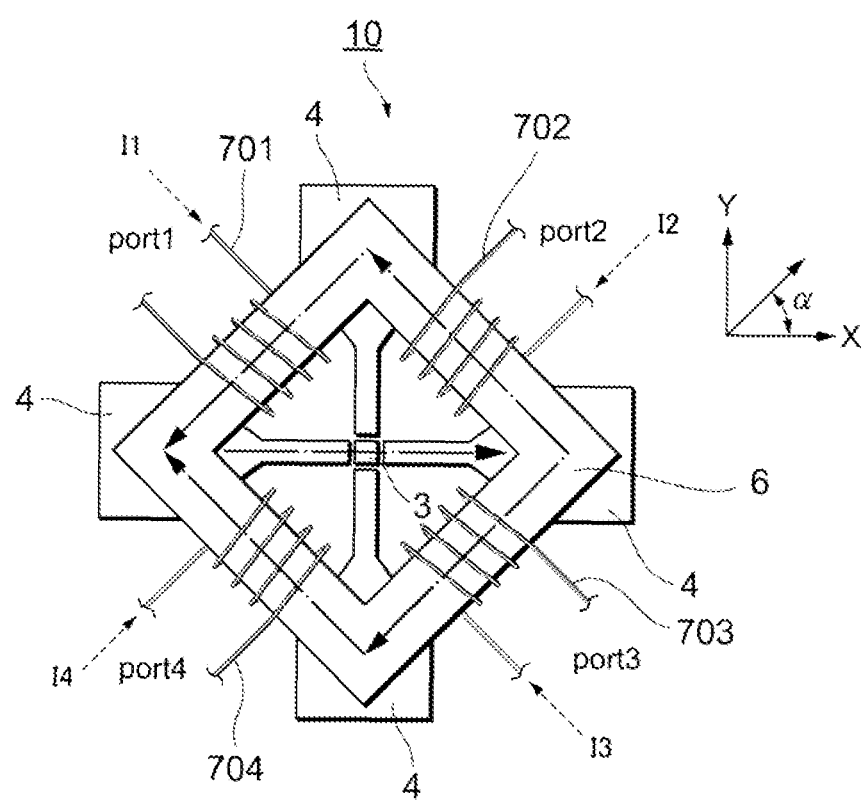
FIG. 24 is an illustration to explain flow of magnetic flux when a magnetic field is applied in a direction of $\alpha=0°$ in the magnetic element 10 according to the first embodiment of the present invention.
Figure 25:
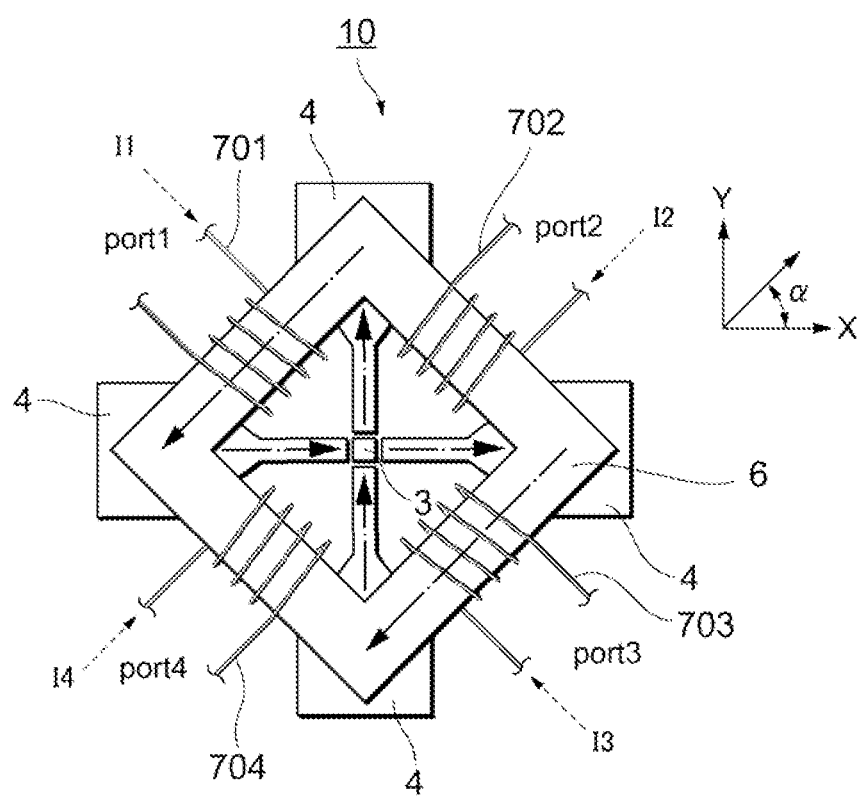
FIG. 25 is an illustration to explain flow of magnetic flux when a magnetic field is applied in a direction of $\alpha=45°$ in the magnetic element 10 according to the first embodiment of the present invention.
Figure 26:
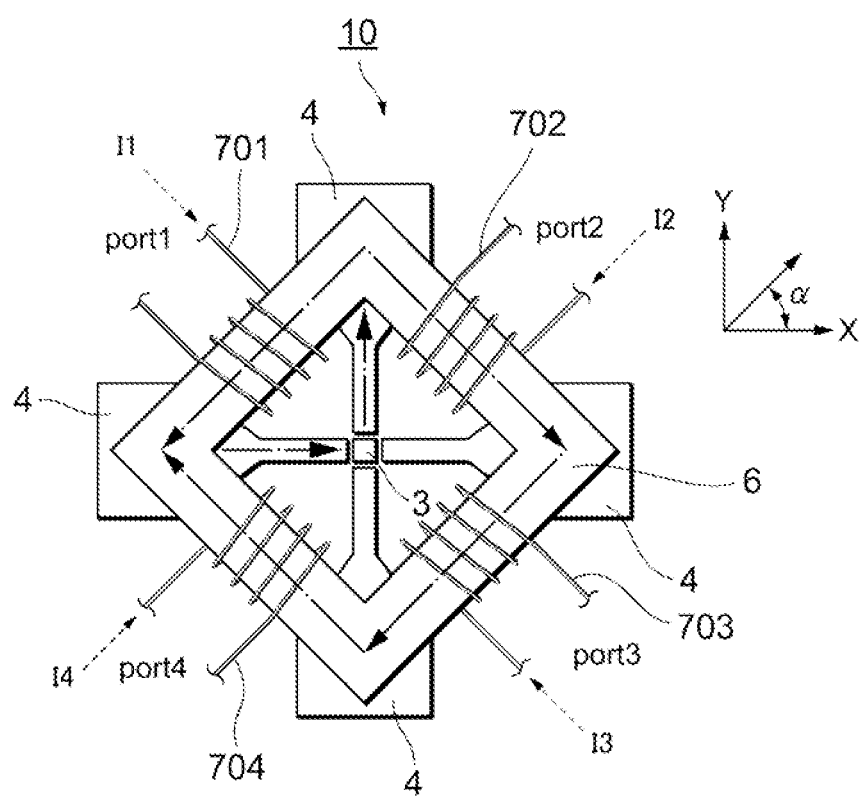
FIG. 26 is an illustration to explain flow of magnetic flux when a magnetic field is applied in a direction of $\alpha=45°$ by employing another method in the magnetic element 10 according to the first embodiment of the present invention.

A structure of a magnetic element 500 according to a fifth embodiment of the present invention will be described below with reference to FIGS. 22 and 23. Because a plan view of the magnetic element 500 according to the fifth embodiment is the same as that illustrated in FIG. 15, the following description is made with reference to FIG. 15 as well. FIG. 22 is a sectional view, taken along the line A-A in FIG. 15, representing the fifth embodiment, and FIG. 23 is a sectional view, taken along the line B-B in FIG. 15, representing the fifth embodiment. The magnetic element 500 is different from the magnetic element 200 of the second embodiment in that, while the insulating layer 8 is disposed between the first soft magnetic layer 4 and the third soft magnetic layer 9 and between the second soft magnetic layer 6 and the third soft magnetic layer 9 in the magnetic element 200 of the second embodiment, the first soft magnetic layer 4 and the third soft magnetic layer 9 are directly connected to each other and the second soft magnetic layer 6 and the third soft magnetic layer 9 are directly connected to each other in the magnetic element 500. As a result, in the magnetic element 500, the magnetic coupling between the first soft magnetic layer 4 and the third soft magnetic layer 9 can be intensified and the magnetic coupling between the second soft magnetic layer 6 and the third soft magnetic layer 9 can be intensified in comparison with those in the magnetic element 200 of the second embodiment. Accordingly, leakage magnetic fields leaking to the outside from the second soft magnetic layer 6 and the third soft magnetic layer 9 can be reduced.

The present invention has been described in detail above with reference to preferred embodiments, but the present invention is not limited to the above-described embodiments. The present invention can be variously modified within the scope not departing from the gist of the invention defined in Claims.

As one example, while, in the above-described embodiments, the coil in the wound form is employed as the magnetic field generation source using a current, the magnetic field generation source using a current may be in the form of a wire. In such a case, the magnetic field generation source in the form of a wire may be disposed near the second soft magnetic layer 6 such that the magnetic field generation source in the form of a wire and the second soft magnetic layer 6 are magnetically connected to each other.

As another example, while the above-described embodiments employ a bottom-type spin valve multilayer structure in which the magnetic pinned layer 33 is disposed on the side close to the lower electrode layer 2 and the magnetic free layer 35 is disposed on the side close to the upper electrode layer 5, the magnetic element may have a top type spin valve structure in which the magnetic pinned layer 33 is disposed on the side close to the upper electrode layer 5 and the magnetic free layer 35 is disposed on the side close to the lower electrode layer 2.

As still another example, while, in the above-described embodiments, the first soft magnetic layer 4, the third soft magnetic layer 9, and the second soft magnetic layer 6 are successively disposed on the substrate 1 in the mentioned order, the second soft magnetic layer 6, the third soft magnetic layer 9, and the first soft magnetic layer 4 may be successively disposed on the substrate 1 in the mentioned order.

The present invention is applicable in industrial fields to a local oscillator, a transmitter/receiver for wireless communication, a microwave-assisted magnetic recording (MAMR) element, a matching circuit, a frequency-variable antenna device, and so on.

REFERENCE SIGNS LIST 1 substrate
2 lower electrode layer
3 magnetoresistive effect film
31 buffer layer
32 antiferromagnetic layer
33 magnetic pinned layer
34 nonmagnetic spacer layer
35 magnetic free layer
36 cap layer
4 first soft magnetic layer
41 first soft magnetic layer fore-end region
42 first soft magnetic layer rear-end region
43 fore end of first soft magnetic layer
5 upper electrode layer
6 second soft magnetic layer
7, 701, 702, 703, 704 coils
71 lower line
72 side line
73 upper line
8, 81, 82, 83, 84, 85, 86, 87 insulating layers
9 third soft magnetic layer
10, 100, 200, 300, 400, 500 magnetic elements
11 bias tee
12 power amplifier
13 spectrum analyzer
14 source meter
15 diode

What is claimed is:

1. A magnetic element comprising:
a magnetoresistive effect film including a nonmagnetic spacer layer, a first ferromagnetic layer, and a second ferromagnetic layer, the first and second ferromagnetic layers being disposed with the nonmagnetic spacer layer interposed therebetween;
a pair of electrodes disposed with the magnetoresistive effect film interposed therebetween in a stacking direction of the magnetoresistive effect film;
at least two first soft magnetic layers;
a magnetic field generation source using a current; and
a second soft magnetic layer magnetically connected to the magnetic field generation source,
wherein the second soft magnetic layer has a ring-like shape,
a spacing distance between the second soft magnetic layer and the magnetoresistive effect film is larger than a spacing distance between the first soft magnetic layer and the magnetoresistive effect film,
a film thickness of the second soft magnetic layer is larger than a film thickness of the first soft magnetic layer,
a part of each of the at least two first soft magnetic layers overlaps a part of the second soft magnetic layer in the stacking direction,
the first soft magnetic layer and the second soft magnetic layer are magnetically coupled to each other, and
the magnetoresistive effect film is disposed between respective fore ends of the at least two first soft magnetic layers.

2. The magnetic element according to claim 1, wherein the first soft magnetic layers are each in form of a flat plate, and a third soft magnetic layer is disposed between the first soft magnetic layer and the second soft magnetic layer.

3. The magnetic element according to claim 2, wherein the second soft magnetic layer and the third soft magnetic layer are directly connected to each other.

4. The magnetic element according to claim 2, wherein the first soft magnetic layer and the third soft magnetic layer are directly connected to each other.

5. The magnetic element according to claim 2, wherein the first soft magnetic layer and the third soft magnetic layer are directly connected to each other, and the second soft magnetic layer and the third soft magnetic layer are directly connected to each other.

6. The magnetic element according to claim 1, wherein a saturation magnetic flux density of the first soft magnetic layer is larger than a saturation magnetic flux density of the second soft magnetic layer.

7. The magnetic element according to claim 2, wherein a saturation magnetic flux density of the first soft magnetic layer is larger than a saturation magnetic flux density of the third soft magnetic layer.

8. The magnetic element according to claim 2, wherein a saturation magnetic flux density of the first soft magnetic layer is larger than a saturation magnetic flux density of the second soft magnetic layer.

9. The magnetic element according to claim 3, wherein a saturation magnetic flux density of the first soft magnetic layer is larger than a saturation magnetic flux density of the second soft magnetic layer.

10. The magnetic element according to claim 4, wherein a saturation magnetic flux density of the first soft magnetic layer is larger than a saturation magnetic flux density of the second soft magnetic layer.

11. The magnetic element according to claim 5, wherein a saturation magnetic flux density of the first soft magnetic layer is larger than a saturation magnetic flux density of the second soft magnetic layer.

12. The magnetic element according to claim 3, wherein a saturation magnetic flux density of the first soft magnetic layer is larger than a saturation magnetic flux density of the third soft magnetic layer.

13. The magnetic element according to claim 4, wherein a saturation magnetic flux density of the first soft magnetic layer is larger than a saturation magnetic flux density of the third soft magnetic layer.

14. The magnetic element according to claim 5, wherein a saturation magnetic flux density of the first soft magnetic layer is larger than a saturation magnetic flux density of the third soft magnetic layer.

15. The magnetic element according to claim 6, wherein a saturation magnetic flux density of the first soft magnetic layer is larger than a saturation magnetic flux density of the third soft magnetic layer.

16. The magnetic element according to claim 8, wherein a saturation magnetic flux density of the first soft magnetic layer is larger than a saturation magnetic flux density of the third soft magnetic layer.

17. The magnetic element according to claim 9, wherein a saturation magnetic flux density of the first soft magnetic layer is larger than a saturation magnetic flux density of the third soft magnetic layer.

18. The magnetic element according to claim 10, wherein a saturation magnetic flux density of the first soft magnetic layer is larger than a saturation magnetic flux density of the third soft magnetic layer.

19. The magnetic element according to claim 11, wherein a saturation magnetic flux density of the first soft magnetic layer is larger than a saturation magnetic flux density of the third soft magnetic layer.

\* \* \* \* \*